(12) United States Patent
Toyoda et al.

(10) Patent No.: US 10,964,686 B2
(45) Date of Patent: Mar. 30, 2021

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Yoshiaki Toyoda, Matsumoto (JP); Hideaki Katakura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/894,364

(22) Filed: Jun. 5, 2020

(65) Prior Publication Data

US 2020/0335490 A1 Oct. 22, 2020

Related U.S. Application Data

(60) Division of application No. 16/189,583, filed on Nov. 13, 2018, now Pat. No. 10,720,421, which is a
(Continued)

(30) Foreign Application Priority Data

Mar. 17, 2015 (JP) .............................. JP2015-053980

(51) Int. Cl.
*H01L 27/02* (2006.01)
*H01L 29/861* (2006.01)
(Continued)

(52) U.S. Cl.
CPC ...... *H01L 27/0255* (2013.01); *H01L 21/8238* (2013.01); *H01L 27/0259* (2013.01);
(Continued)

(58) Field of Classification Search
CPC ............ H01L 27/0255; H01L 29/7813; H01L 29/8611; H01L 29/0603; H01L 27/0277;
(Continued)

(56) References Cited

U.S. PATENT DOCUMENTS 6,323,518 B1 11/2001 Sakamoto et al.
2002/0158277 A1 10/2002 Harada et al.
(Continued)

FOREIGN PATENT DOCUMENTS

JP H0349257 A 3/1991
JP H05206387 A 8/1993
(Continued)

*Primary Examiner* — Shahed Ahmed
(74) *Attorney, Agent, or Firm* — Rabin & Berdo, P.C.

(57) ABSTRACT

In a method of manufacturing a semiconductor device, selectively forming a first semiconductor region and a fourth semiconductor region to be away from each other in a surface layer of a first principal surface of a semiconductor substrate at a same impurity implantation and impurity diffusion process, selectively forming a second semiconductor region in the first semiconductor region and selectively forming a fifth semiconductor region in the fourth semiconductor region at a same impurity implantation and impurity diffusion process, and selectively forming a third semiconductor region that penetrates the first semiconductor region in a depth direction and selectively forming a sixth semiconductor region that penetrates the fourth semiconductor region in the depth direction at a same impurity implantation and impurity diffusion process.

1 Claim, 26 Drawing Sheets

Related U.S. Application Data division of application No. 15/447,088, filed on Mar. 1, 2017, now Pat. No. 10,141,299, which is a continuation of application No. PCT/JP2016/058211, filed on Mar. 15, 2016.

(51) Int. Cl.

| | | |
|---|---|---|
| *H01L 29/06* | (2006.01) | |
| *H01L 29/78* | (2006.01) | |
| *H01L 21/8238* | (2006.01) | |
| *H01L 27/092* | (2006.01) | |
| *H01L 29/868* | (2006.01) | |
| *H01L 29/423* | (2006.01) | |
| *H01L 27/088* | (2006.01) | |

(52) U.S. Cl.
CPC ........ *H01L 27/0277* (2013.01); *H01L 27/092* (2013.01); *H01L 29/06* (2013.01); *H01L 29/0603* (2013.01); *H01L 29/0688* (2013.01); *H01L 29/0692* (2013.01); *H01L 29/4236* (2013.01); *H01L 29/7804* (2013.01); *H01L 29/7813* (2013.01); *H01L 29/861* (2013.01); *H01L 29/868* (2013.01); *H01L 29/8611* (2013.01); *H01L 27/088* (2013.01); *H01L 27/0922* (2013.01); *H01L 29/78* (2013.01)

(58) Field of Classification Search
CPC ............. H01L 29/0688; H01L 29/0692; H01L 27/0259; H01L 29/7804; H01L 29/861; H01L 29/06; H01L 21/8238; H01L 29/868; H01L 27/0922; H01L 29/78; H01L 27/088; H01L 29/66674–66734; H01L 29/7801–7826

See application file for complete search history.

(56) References Cited

U.S. PATENT DOCUMENTS

| | | | |
|---|---|---|---|
| 2003/0201483 A1* | 10/2003 | Sumida | H01L 21/26513 257/302 |
| 2004/0026728 A1 | 2/2004 | Yoshida et al. | |
| 2004/0238893 A1 | 12/2004 | Tobisaka et al. | |
| 2009/0014719 A1* | 1/2009 | Shimizu | H01L 27/0605 257/49 |
| 2009/0065899 A1 | 3/2009 | Shimamura | |
| 2010/0193869 A1 | 8/2010 | Habasaki | |
| 2010/0264493 A1 | 10/2010 | Izutsu et al. | |
| 2011/0006341 A1 | 1/2011 | Sawahata | |
| 2012/0032228 A1 | 2/2012 | Sawahata et al. | |
| 2012/0104553 A1 | 5/2012 | Fujii | |
| 2015/0028352 A1* | 1/2015 | Okumura | H01L 21/049 257/77 |
| 2016/0079235 A1* | 3/2016 | Matsudai | H01L 27/0727 257/140 |

FOREIGN PATENT DOCUMENTS

| | | |
|---|---|---|
| JP | 2000091344 A | 3/2000 |
| JP | 2002359294 A | 12/2002 |
| JP | 2003338604 A | 11/2003 |
| JP | M04327976 A | 11/2004 |
| JP | 2005223016 A | 8/2005 |
| JP | 2005235844 A | 9/2005 |
| JP | 2006093361 A | 4/2006 |
| JP | 2009064974 A | 3/2009 |
| JP | 2010157642 A | 7/2010 |
| JP | 2010182727 A | 8/2010 |
| JP | 2010251522 A | 11/2010 |
| JP | 2010287909 A | 12/2010 |
| JP | 2011018685 A | 1/2011 |
| JP | 2012038974 A | 2/2012 |
| JP | 2012094565 A | 5/2012 |
| JP | 2012094797 A | 5/2012 |
| JP | 2012099626 A | 5/2012 |

* cited by examiner

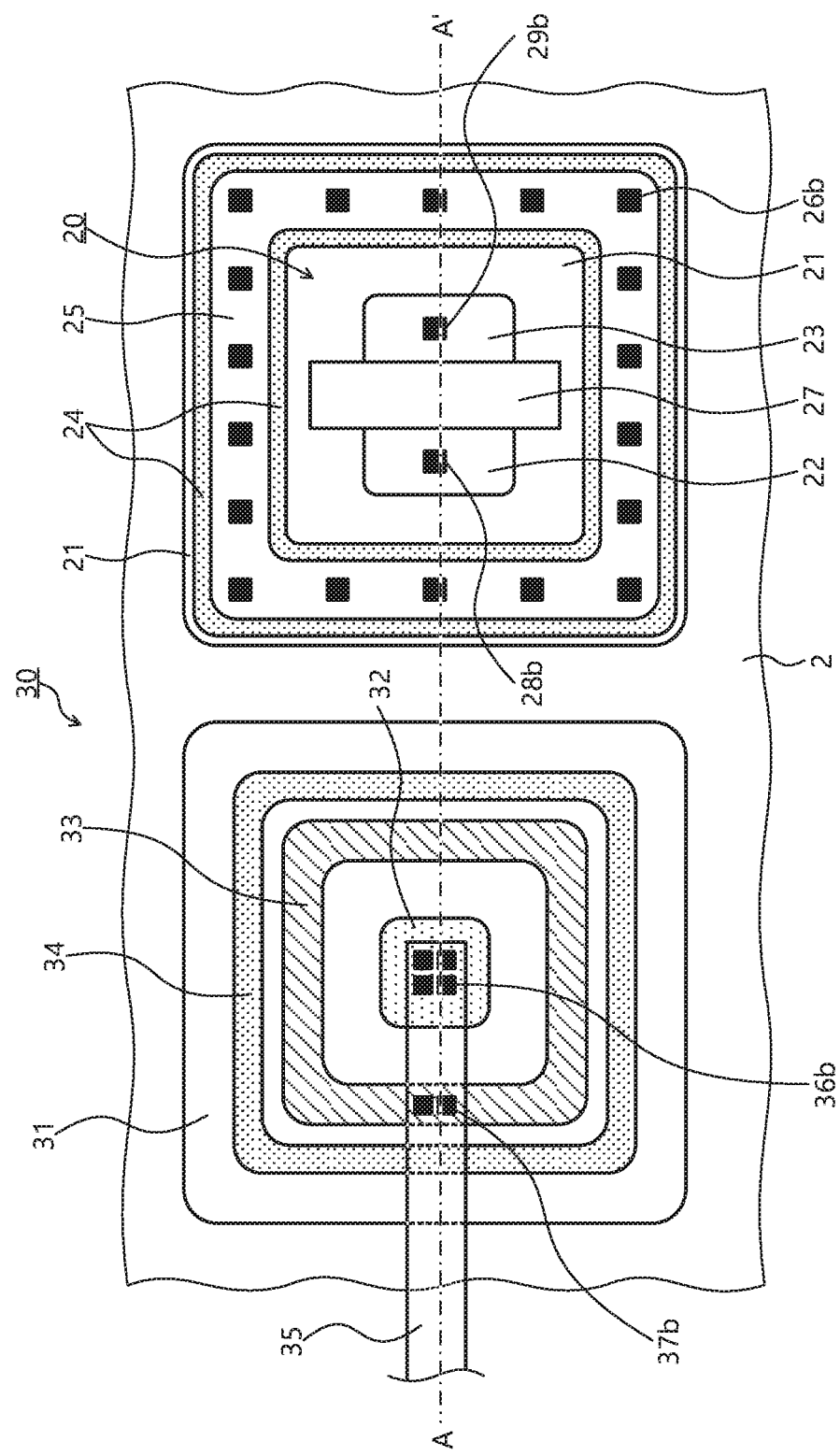

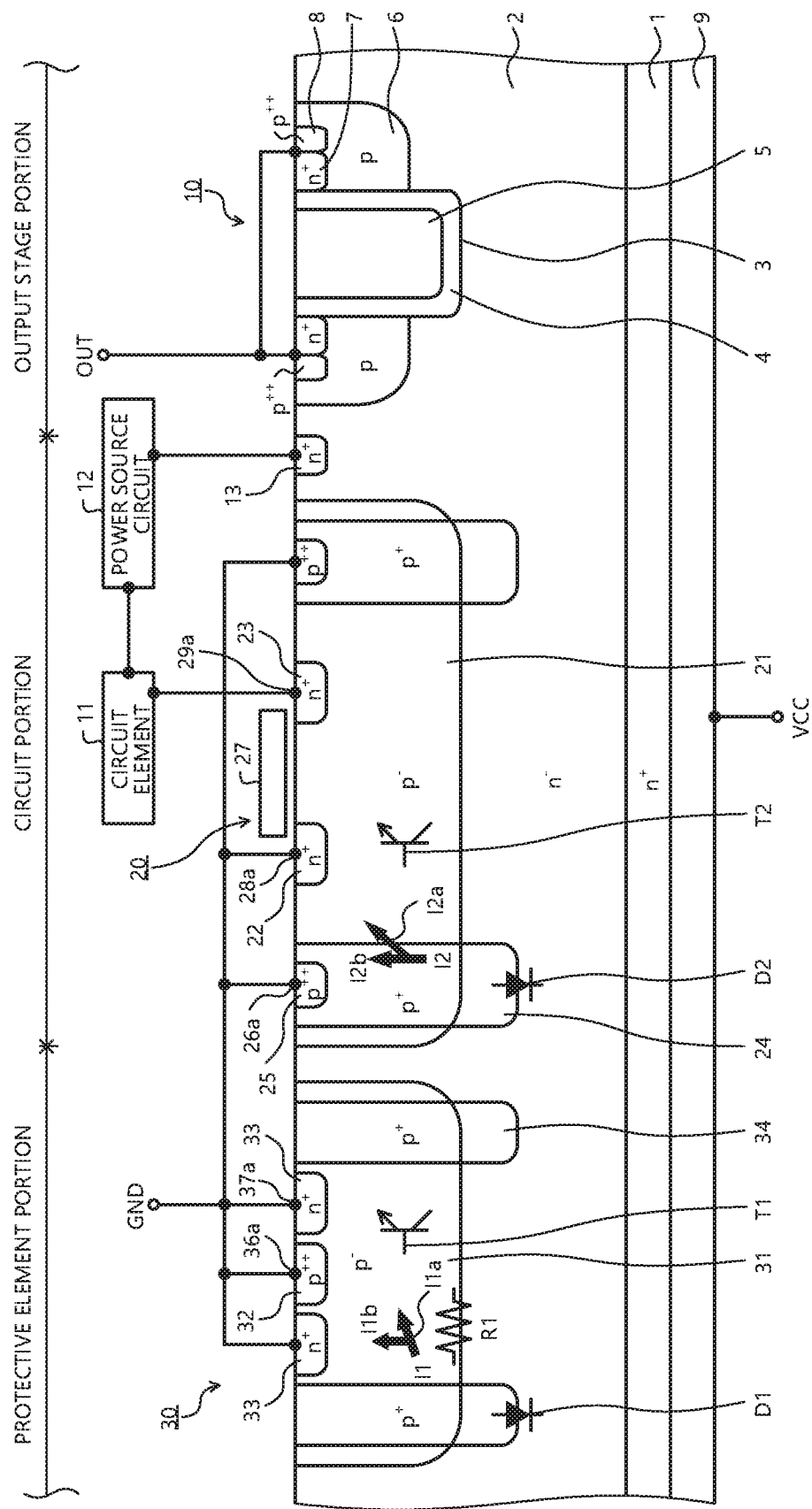

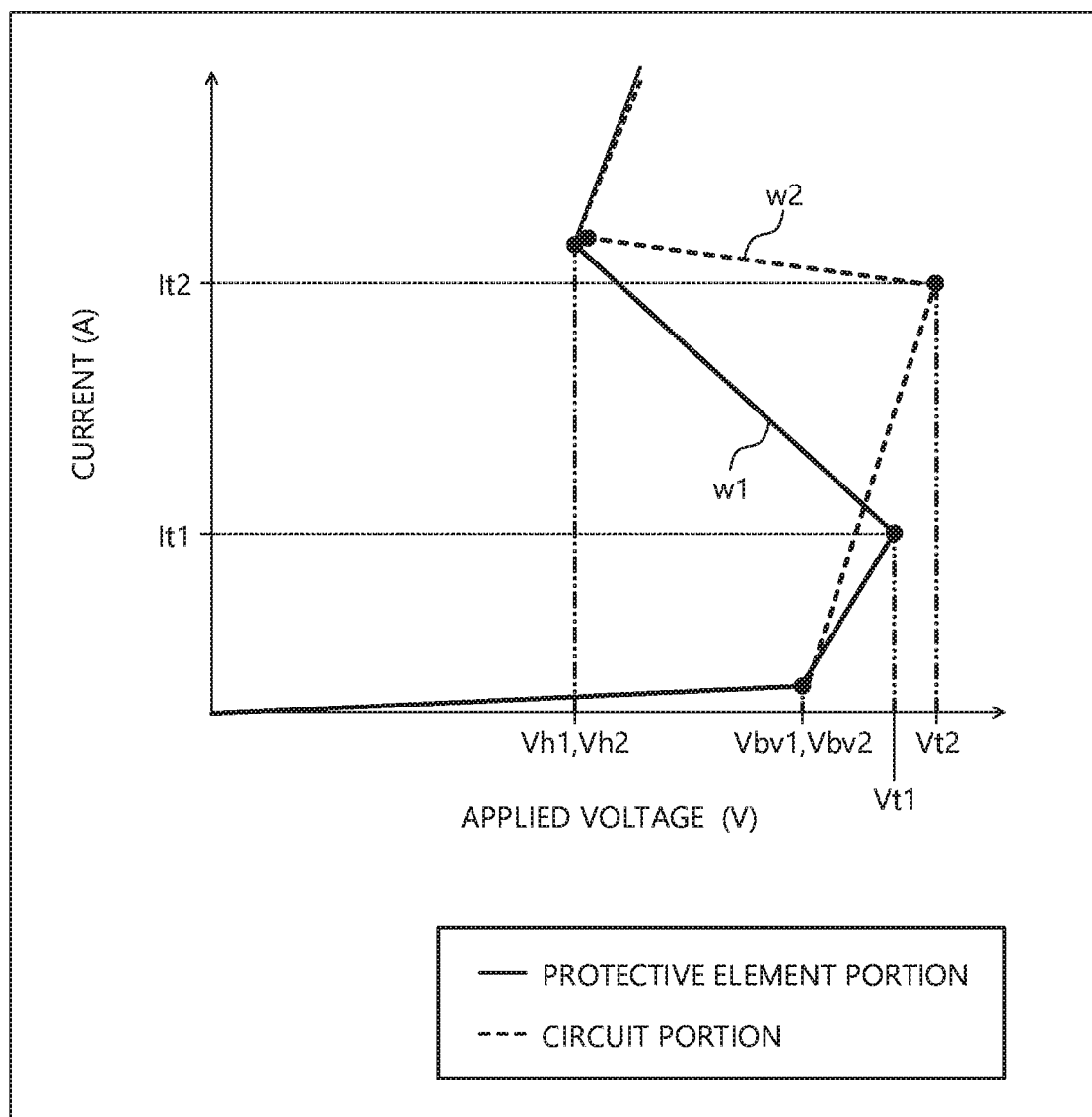

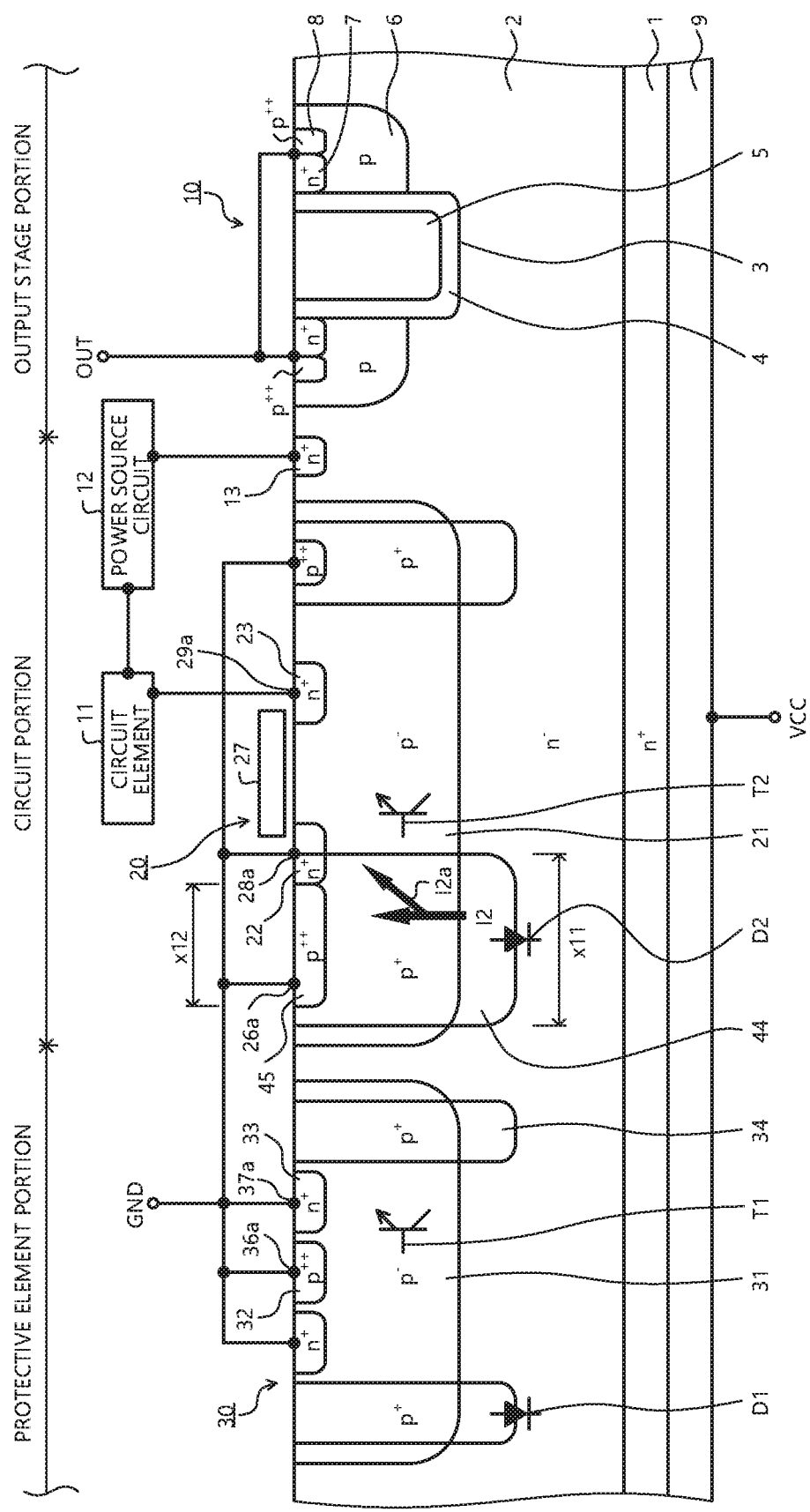

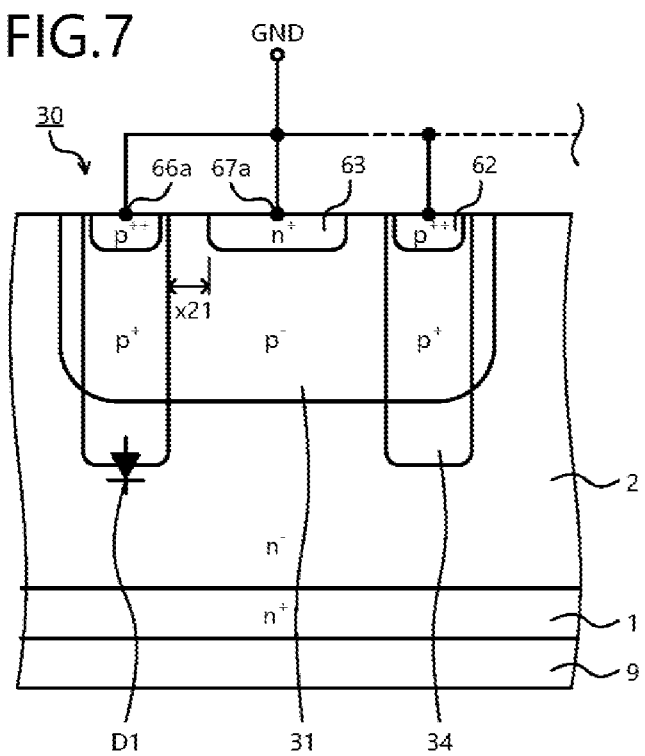

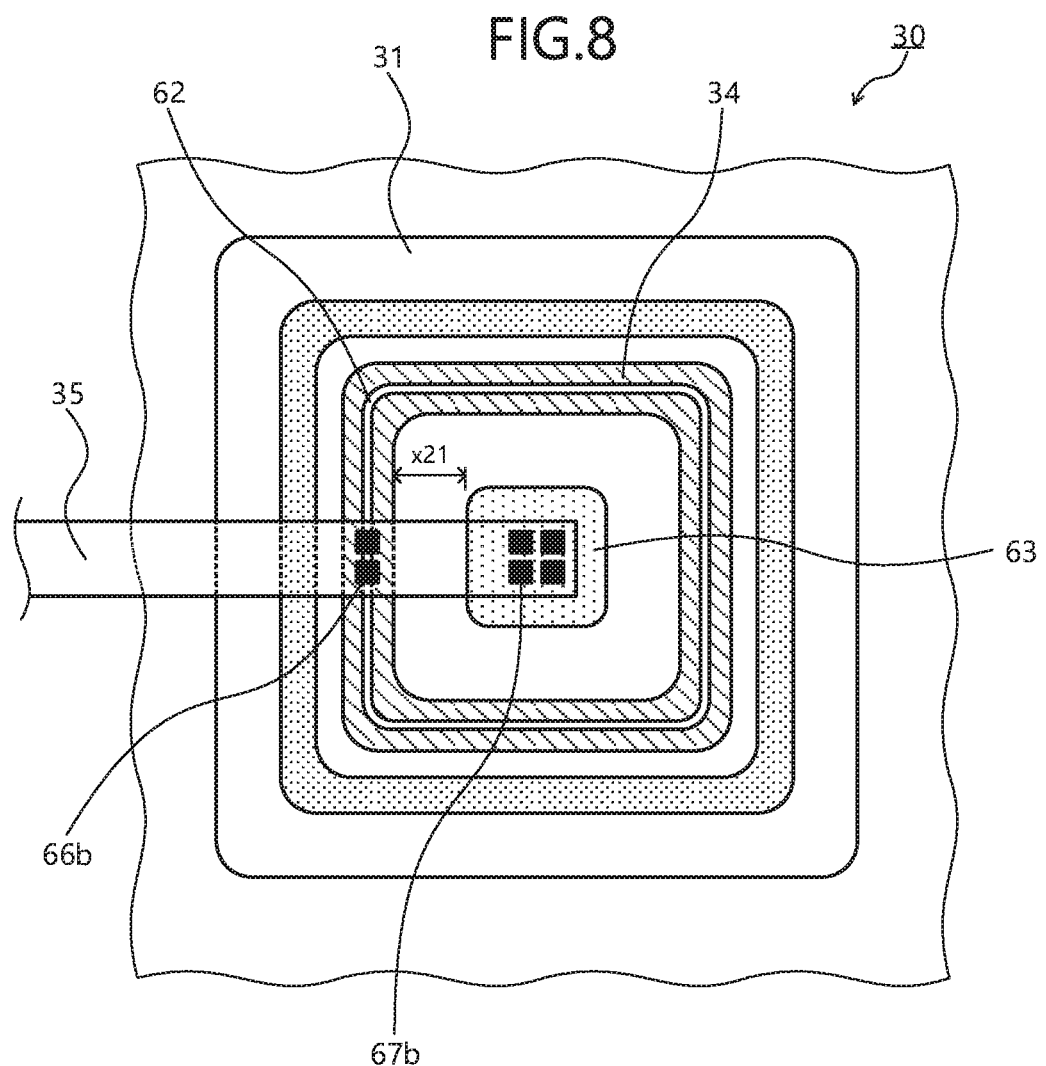

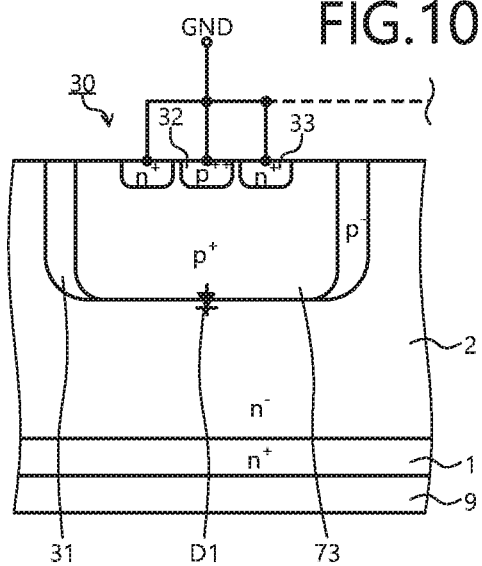
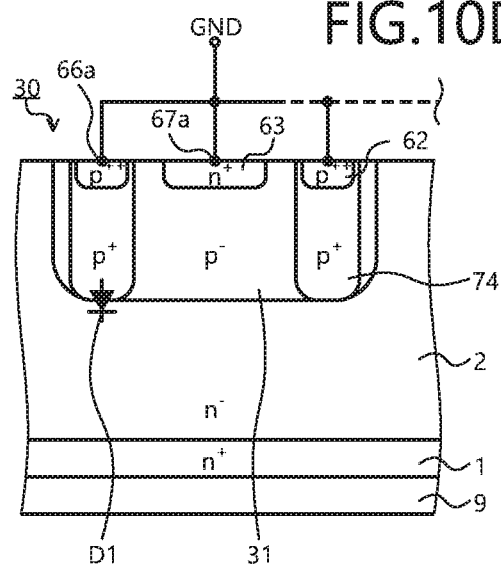
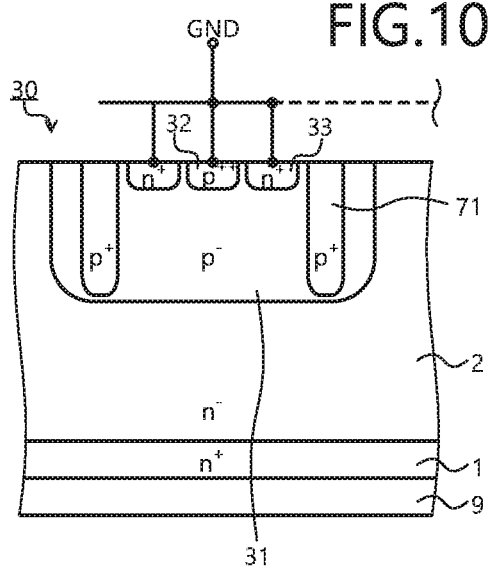

SEMICONDUCTOR DEVICE AND METHOD OF MANUFACTURING SEMICONDUCTOR DEVICE

CROSS REFERENCE TO RELATED APPLICATIONS

This application is a divisional of U.S. application Ser. No. 16/189,583, filed on Nov. 13, 2018, which was a divisional of U.S. application Ser. No. 15/447,088, filed on Mar. 1, 2017 (issued on Nov. 27, 2018 as U.S. Pat. No. 10,141,299), which was a continuation application of International Application PCT/JP2016/058211 filed on Mar. 15, 2016, which claims priority from a Japanese Patent Application No. 2015-053980 filed on Mar. 17, 2015, the contents of which are incorporated herein by reference.

BACKGROUND OF THE INVENTION

1. Field of the Invention

The embodiments discussed herein relate to a semiconductor device and a method of manufacturing a semiconductor device.

2. Description of the Related Art

A known power semiconductor device has a vertical power semiconductor element and a horizontal semiconductor element for control and protection circuits of the vertical power semiconductor element provided on a single semiconductor substrate (a semiconductor chip) to enhance reliability and achieve reductions in the size and cost of the power semiconductor element (see, for example, Japanese Laid-Open Patent Publication Nos. 2002-359294 and 2000-91344). The structure of a traditional semiconductor device will be described taking an example of a power semiconductor device that has provided on a single semiconductor substrate, a vertical n-channel power metal oxide semiconductor field effect transistor (MOSFET) for an output stage and a horizontal complementary MOS (CMOS) for a control circuit. FIG. 13 is a cross-sectional diagram of the structure of the traditional semiconductor device.

The traditional semiconductor device depicted in FIG. 13 is an example of an in-vehicle, high-side power integrated circuit (IC) having a vertical MOSFET 110 of a trench gate structure as a vertical n-channel power MOSFET for the output stage. As depicted in FIG. 13, the traditional semiconductor device includes an output stage portion, a circuit portion, and a protective element portion that protects the output stage portion and the circuit portion from surges, on an n-type semiconductor base substrate (a semiconductor substrate) formed by depositing an n$^-$-type semiconductor layer 102 on a front surface of an n$^+$-type supporting substrate 101. The output stage portion is provided with the vertical MOSFET 110 for the output stage. The circuit portion is provided with the horizontal CMOS for the control circuit, and the like. In the circuit portion, only a horizontal n-channel MOSFET 120 is depicted of a horizontal p-channel MOSFET and the horizontal n-channel MOSFET that are complementarily connected to each other to constitute a horizontal CMOS for the control circuit. The protective element portion is provided with a vertical diode 130 to be the protective element portion.

In the output stage portion, the n$^+$-type supporting substrate 101 and the n$^-$-type semiconductor layer 102 respectively function as a drain layer and a drift layer. A drain electrode 109 (a drain terminal) connected to the rear surface of the base substrate (the rear surface of the n$^+$-type supporting substrate 101) is a power source voltage terminal to which an in-vehicle battery is connected (hereinafter, referred to as "VCC terminal"). A ground terminal (hereinafter, referred to as "GND terminal") and an output terminal (hereinafter, referred to as "OUT terminal") are provided on the front surface side of the base substrate (the opposite side of the n$^-$-type semiconductor layer 102 from the n$^+$-type supporting substrate 101 side). The OUT terminal is electrically connected to an n$^+$-type source region 107 and a p$^{++}$-type diffusion region 108 of the vertical MOSFET 110. Reference numerals "103" to "106" respectively denote a trench, a gate insulating film, a gate electrode, and a p-type base region of the vertical MOSFET 110.

The horizontal n-channel MOSFET 120 constituting the horizontal CMOS of the circuit portion is arranged in a p$^-$-type base region 121 selectively provided in the surface layer of the front surface of the base substrate. In an outer periphery of the p$^-$-type base region 121, a p$^+$-type diffusion region 124 is provided to be away from an n$^+$-type source region 122 and an n$^+$-type drain region 123 of the horizontal n-channel MOSFET 120. The depth of the p$^+$-type diffusion region 124 is equal to the depth of the p$^-$-type base region 121 or is deeper than the depth of the p$^-$-type base region 121. FIG. 13 depicts a case where the depth of the p$^+$-type diffusion region 124 is deeper than the depth of the p$^-$-type base region 121. The p$^+$-type diffusion region 124 functions as an inversion preventive layer that prevents inversion of the p$^-$-type base region 121 due to the potential of a wiring layer that is deposited on the front surface of the base substrate.

In the p$^+$-type diffusion region 124, a p$^{++}$-type contact region 125 is selectively provided to be a contact (an electrical contact portion) with the wiring layer. FIG. 13 depicts an example of a case where the horizontal n-channel MOSFET 120 is used in each of various types of inverter circuits such as a CMOS inverter, an enhanced/depletion (ED) inverter, and a resistance load inverter in the control circuit, and a source electrode connected to the n$^+$-type source region 122 of the horizontal n-channel MOSFET is electrically connected to the GND terminal. The p$^-$-type base region 121 to be a back gate is also electrically connected to the GND terminal through the p$^+$-type diffusion region 124 and the p$^{++}$-type contact region 125. Reference numeral "126" denotes a gate electrode of the horizontal n-channel MOSFET 120.

The drain terminal connected to the n$^+$-drain region 123 of the horizontal n-channel MOSFET 120 is connected to circuit elements 111 such as the horizontal p-channel MOSFET, a depletion MOSFET, and a resistive element, to constitute the various types of inverter circuits in the control circuit. The circuit elements 111 are connected to an n$^+$-type diffusion region 113 selectively provided in the surface layer of the front surface of the base substrate through a power source circuit 112. The power source circuit 112 includes high voltage circuit elements (not depicted), receives a power source voltage potential (a potential of the VCC terminal) of the n-type semiconductor base substrate, and outputs a low potential to the circuit elements 111 to supply the power source voltage to the various types of inverter circuits that are constituted by the horizontal n-channel MOSFET 120 and the circuit elements 111. A high surge tolerance is required of this in-vehicle power IC.

When high surge voltage such as electro-static discharge (ESD) or the like is applied between the VCC terminal and the GND terminal, a surge sequentially intrudes in the n⁻-type semiconductor layer 102, the power source circuit 112, the circuit elements 111, the horizontal n-channel MOSFET 120, and the GND terminal along a path from the VCC terminal, and a high voltage is applied. Of the constituent components that the surge intrudes in, the circuit elements 111 and the horizontal n-channel MOSFET 120 each has a small size, and each of the elements as a single component has a low surge tolerance. The vertical diode 130 for absorbing surge current (for protection from surge) is therefore connected in parallel between the VCC terminal and the GND terminal. The vertical diode 130 includes a pn-junction formed by selectively providing a p⁺-type diffusion region 131 in the surface layer of the front surface of the base substrate. To avoid increases in the number of the process steps in forming the vertical diode 130 in the same n-type semiconductor base substrate as that of the horizontal n-channel MOSFET 120, a p⁺-type diffusion region 131 of the vertical diode 130 is formed concurrently with the p⁺-type diffusion region 124 of the horizontal n-channel MOSFET 120.

The vertical diode 130 is subject to avalanche breakdown when surge voltage is applied between the VCC terminal and the GND terminal, and thereby causes a current I101 to flow in the vertical direction from the VCC terminal side toward the GND terminal through the p⁺-type diffusion region 131 and a p⁺⁺-type contact region 132 to absorb the surge current. Meanwhile, a pn-junction similar to that of the vertical diode 130 is formed between the p⁺-type diffusion region 124 and the n⁻-type semiconductor layer 102 provided in the circuit portion (the region in which the horizontal n-channel MOSFET 120 is provided). The pn-junction between the p⁺-type diffusion region 124 and the n⁻-type semiconductor layer 102 also are subject to breakdown by an applied voltage that is substantially equal to that for the vertical diode 130. This is equivalent to plural vertical diodes 127 whose pn-junction areas are each smaller than that of the vertical diode 130 (hereinafter, referred to as "circuit portion diode") being incorporated in the circuit portion, and a portion of the circuit portion occupying a large area in the power IC being usable as the vertical diode 130 for surge protection. The effective pn-junction area of the vertical diode 130 for surge protection can therefore be increased.

The breakdown current amount (the maximal current value that does not cause current breakdown) of the vertical diode 130 increases in proportion to the pn-junction area. By configuring the circuit portion diode 127 using the portion of the circuit portion, the resistance to breakdown of the vertical diode 130 itself can therefore be improved relative to a case where the vertical diode 130 is configured alone and associated with this, the surge tolerance of the power IC can be improved. The breakdown voltage of the vertical diode 130 is increased with an increase of the temperature. Even assuming that current concentrates at the circuit portion diode 127 that is configured using the portion of the circuit portion and that has a small pn-junction area, the breakdown voltage of the circuit portion diode 127 is therefore increased by heat generation and the concentration of the current at the circuit portion diode 127 is alleviated. Local breakdown of the circuit portion therefore tends to be avoided even when the circuit portion diodes 127 are scattered in the circuit portion as above.

On the other hand, without limitation to the power IC, a technique is generally known of improving surge tolerance using a bipolar element as a protective element for surge protection instead of a diode. When a bipolar element is used as a protective element for surge protection, the surge tolerance of an element to be protected is improved by improving the capacity to absorb surge current using the snapback property of the bipolar element. The snapback property of the bipolar element depends on the device structure, and a protective element including various types of bipolar structures has therefore been proposed to improve this property (see, for examples, Japanese Laid-Open Patent Publication Nos. 2006-93361, 2009-64974, 2011-18685, 2012-38974, 2012-94797, 2012-99626, H3-49257, 2010-287909, 2010-182727, and 2010-157642). In Japanese Laid-Open Patent Publication No. 2006-93361, the base width of a base layer of a bipolar ESD protective element is increased by providing a semiconductor layer of the same semiconductor type as that of and continuous with a lower portion layer of the base layer of the bipolar ESD protective element, to thereby improve the breakdown voltage property of the bipolar ESD protective element itself.

In Japanese Laid-Open Patent Publication No. 2009-64974, a contact portion between a base electrode and a base region of a protective element is positioned between an end on the side of a collector electrode of the base region and an emitter region, and a hold voltage of the protective element is thereby increased. In Japanese Laid-Open Patent Publication No. 2011-18685, the bipolar operation of a protective element is started using a breakdown of a trigger element as a trigger, and the ESD capacity and the noise tolerance are thereby improved. In Japanese Laid-Open Patent Publication No. 2012-38974, a configuration is employed for a thyristor that is a protective element to be operated using a breakdown of a bipolar transistor as a trigger, and the trigger voltage is adjusted independently from the hold voltage of the thyristor. In Japanese Laid-Open Patent Publication No. 2012-94797, a recess is formed in a bottom portion of a body layer under an n⁺-type source layer of a protective element and the snapback voltage of the protective element is set to be lower than the snapback voltage of an element to be protected.

In Japanese Laid-Open Patent Publication No. 2012-99626, only the trigger voltage is adjusted without varying the hold voltage by adjusting the interval between a second conductivity type layer and a base layer provided inside the low concentration collector layer of a protective element. In Japanese Laid-Open Patent Publication No. H3-49257, increases in the chip area are suppressed by forming on a bottom surface of an impurity diffusion layer or a semiconductor layer formed in each partitioned region, a pn-junction diode whose reverse avalanche voltage is set to be higher than the normal operation voltage of a semiconductor device and to be lower than the breakdown voltages of the elements constituting the semiconductor device. In Japanese Laid-Open Patent Publication No. 2010-287909, the ESD capacity and the surge tolerance are increased by setting the resistance during a breakdown operation of a diode to be smaller than the resistance during a breakdown operation of a transistor and setting a secondary breakdown current of the diode to be larger than a secondary breakdown current of the transistor. Japanese Laid-Open Patent Publication Nos. 2010-182727 and 2010-157642 each discloses a method of suppressing the voltage at which a parasitic bipolar element starts to snap back.

SUMMARY OF THE INVENTION

According to one aspect of the present invention, a semiconductor device includes a first semiconductor region of a second conductivity type selectively provided in a surface layer of a first principal surface of a semiconductor substrate of a first conductivity type; an element structure of a semiconductor element provided in the first semiconductor region; a second semiconductor region of the first conductivity type selectively provided in the first semiconductor region, the second semiconductor region constituting the element structure of the semiconductor element; a third semiconductor region of the second conductivity type selectively provided to penetrate the first semiconductor region in a depth direction and to surround the element structure of the semiconductor element at a depth equal to or deeper than a depth of the first semiconductor region, the third semiconductor region having an impurity concentration that is higher than that of the first semiconductor region; a fourth semiconductor region of the second conductivity type selectively provided in the surface layer of the first principal surface of the semiconductor substrate to be away from the first semiconductor region; a fifth semiconductor region of the first conductivity type selectively provided in the fourth semiconductor region; a sixth semiconductor region of the second conductivity type selectively provided to penetrate the fourth semiconductor region in the depth direction and to be at a depth equal to or deeper than a depth of the fourth semiconductor region, the sixth semiconductor region having an impurity concentration that is higher than that of the fourth semiconductor region; a first electrode that is electrically connected to the second semiconductor region, the third semiconductor region, the fourth semiconductor region, and the fifth semiconductor region; and a second electrode that is connected to a second principal surface of the semiconductor substrate.

According to another aspect of the present invention, a semiconductor device includes a first semiconductor region of a second conductivity type selectively provided in a surface layer of a first principal surface of a semiconductor substrate of a first conductivity type; an element structure of a semiconductor element provided in the first semiconductor region; a second semiconductor region of the first conductivity type selectively provided in the first semiconductor region, the second semiconductor region constituting the element structure of the semiconductor element; a third semiconductor region of the second conductivity type selectively provided in the first semiconductor region to surround the element structure of the semiconductor element, the third semiconductor region having an impurity concentration that is higher than that of the first semiconductor region; a fourth semiconductor region of the second conductivity type selectively provided in the surface layer of the first principal surface of the semiconductor substrate to be away from the first semiconductor region; a fifth semiconductor region of the first conductivity type selectively provided in the fourth semiconductor region; a sixth semiconductor region of the second conductivity type selectively provided in the fourth semiconductor region, the sixth semiconductor region having an impurity concentration that is higher than that of the fourth semiconductor region; a first electrode that is electrically connected to the second semiconductor region, the third semiconductor region, the fourth semiconductor region, and the fifth semiconductor region; and a second electrode that is connected to a second principal surface of the semiconductor substrate.

The semiconductor device further includes a seventh semiconductor region of the second conductivity type selectively provided in the fourth semiconductor region, the seventh semiconductor region having an impurity concentration that is higher than that of the fourth semiconductor region. The first electrode is electrically connected to the fourth semiconductor region through the seventh semiconductor region. The fifth semiconductor region is arranged between the sixth semiconductor region and the seventh semiconductor region.

The semiconductor device further includes a seventh semiconductor region of the second conductivity type selectively provided in the fourth semiconductor region, the seventh semiconductor region having an impurity concentration that is higher than that of the fourth semiconductor region. The first electrode is electrically connected to the fourth semiconductor region through the seventh semiconductor region. The seventh semiconductor region is arranged to be away from the sixth semiconductor region. The fifth semiconductor region is selectively provided in the sixth semiconductor region.

The semiconductor device further includes a seventh semiconductor region of the second conductivity type selectively provided in the sixth semiconductor region, the seventh semiconductor region having an impurity concentration that is higher than that of the sixth semiconductor region. The first electrode is electrically connected to the fourth semiconductor region through the seventh semiconductor region. The fifth semiconductor region is selectively provided in the sixth semiconductor region.

The semiconductor device further includes a seventh semiconductor region of the second conductivity type selectively provided in the sixth semiconductor region, the seventh semiconductor region having an impurity concentration that is higher than that of the sixth semiconductor region. The first electrode is electrically connected to the fourth semiconductor region through the seventh semiconductor region. The fifth semiconductor region is arranged to be away from the sixth semiconductor region.

In the semiconductor device, the fifth semiconductor region is arranged to surround a periphery of the seventh semiconductor region.

In the semiconductor device, the fifth semiconductor region is arranged to surround a periphery of the seventh semiconductor region, and the sixth semiconductor region is arranged to surround a periphery of the fifth semiconductor region.

In the semiconductor device, the sixth semiconductor region is arranged to surround a periphery of the seventh semiconductor region.

In the semiconductor device, the sixth semiconductor region is arranged to surround a periphery of the fifth semiconductor region.

In the semiconductor device, the sixth semiconductor region has an impurity concentration and a depth equal to those of the third semiconductor region.

In the semiconductor device, the fourth semiconductor region has an impurity concentration and a depth equal to those of the first semiconductor region.

According to still another aspect of the present invention, a semiconductor device includes a first semiconductor region of a second conductivity type selectively provided in a surface layer of a first principal surface of a semiconductor substrate of a first conductivity type; an element structure of a semiconductor element provided in the first semiconductor region; a second semiconductor region of the first conductivity type selectively provided in the first semiconductor region, the second semiconductor region constituting the element structure of the semiconductor element; a third semiconductor region of the second conductivity type selectively provided to penetrate the first semiconductor region in a depth direction and to surround the element structure of the semiconductor element at a depth equal to or deeper than a depth of the first semiconductor region, the third semiconductor region having an impurity concentration that is higher than that of the first semiconductor region; a fourth semiconductor region of the second conductivity type selectively provided in the surface layer of the first principal surface of the semiconductor substrate to be away from the first semiconductor region; a fifth semiconductor region of the first conductivity type selectively provided in the fourth semiconductor region; a first electrode that is electrically connected to the second semiconductor region, the third semiconductor region, the fourth semiconductor region, and the fifth semiconductor region; and a second electrode that is connected to a second principal surface of the semiconductor substrate.

In the semiconductor device, a sixth semiconductor region of the second conductivity type selectively provided in the fourth semiconductor region, the sixth semiconductor region having an impurity concentration that is higher than that of the fourth semiconductor region. The first electrode is electrically connected to the fourth semiconductor region through the sixth semiconductor region. The fifth semiconductor region is arranged to surround a periphery of the sixth semiconductor region.

In the semiconductor device, a distance from the sixth semiconductor region to a contact portion of the fourth semiconductor region and the first electrode is configured such that a first voltage at which a first parasitic bipolar element constituted by the fifth semiconductor region, the fourth semiconductor region, and the semiconductor substrate or a second parasitic bipolar element constituted by the fifth semiconductor region, the sixth semiconductor region, and the semiconductor substrate starts to snap back is lower than a second voltage at which a third parasitic bipolar element constituted by the second semiconductor region, the first semiconductor region, and the semiconductor substrate starts to snap back.

In the semiconductor device, a distance from the sixth semiconductor region to the seventh semiconductor region is configured such that a first voltage at which a first parasitic bipolar element constituted by the fifth semiconductor region, the fourth semiconductor region, and the semiconductor substrate or a second parasitic bipolar element constituted by the fifth semiconductor region, the sixth semiconductor region, and the semiconductor substrate starts to snap back is lower than a second voltage at which a third parasitic bipolar element constituted by the second semiconductor region, the first semiconductor region, and the semiconductor substrate starts to snap back.

In the semiconductor device, a distance from the sixth semiconductor region to the fifth semiconductor region is configured such that a first voltage at which a first parasitic bipolar element constituted by the fifth semiconductor region, the fourth semiconductor region, and the semiconductor substrate starts to snap back is lower than a second voltage at which a second parasitic bipolar element constituted by the second semiconductor region, the first semiconductor region, and the semiconductor substrate starts to snap back.

In the semiconductor device, a distance from a corner portion of the fourth semiconductor region to a contact portion of the fourth semiconductor region and the first electrode is configured such that a first voltage at which a first parasitic bipolar element constituted by the fifth semiconductor region, the fourth semiconductor region and the semiconductor substrate starts to snap back is lower than a second voltage at which a second parasitic bipolar element constituted by the second semiconductor region, the first semiconductor region, and the semiconductor substrate starts to snap back.

In the semiconductor device, a distance from a corner portion of the fourth semiconductor region to the sixth semiconductor region is configured such that a first voltage at which a first parasitic bipolar element constituted by the fifth semiconductor region, the fourth semiconductor region and the semiconductor substrate starts to snap back is lower than a second voltage at which a second parasitic bipolar element constituted by the second semiconductor region, the first semiconductor region, and the semiconductor substrate starts to snap back.

In the semiconductor device, the fourth semiconductor region is configured to have an impurity concentration such that a first voltage at which a first parasitic bipolar element constituted by the fifth semiconductor region, the fourth semiconductor region, and the semiconductor substrate or a second parasitic bipolar element constituted by the fifth semiconductor region, the sixth semiconductor region, and the semiconductor substrate starts to snap back is lower than a second voltage at which a third parasitic bipolar element constituted by the second semiconductor region, the first semiconductor region, and the semiconductor substrate starts to snap back.

In the semiconductor device, the element structure of the semiconductor element includes: the second semiconductor region; an eighth semiconductor region of the first conductivity type selectively provided in the first semiconductor region and away from the second semiconductor region; and a gate electrode that is provided through a gate insulating film on a surface of the first semiconductor region at a portion between the second semiconductor region and the eighth semiconductor region.

In the semiconductor device, the semiconductor device is provided with the first semiconductor region and the fourth semiconductor region formed at a same process step.

In the semiconductor device, the semiconductor device is provided with the third semiconductor region and the sixth semiconductor region formed at a same process step.

In the semiconductor device, the semiconductor device is provided with the second semiconductor region and the fifth semiconductor region formed at a same process step.

In the semiconductor device, the semiconductor device is provided with the third semiconductor region and the fourth semiconductor region formed at a same process step.

The semiconductor device further includes a ninth semiconductor region provided between the fourth semiconductor region and the fifth semiconductor region so as to cover the fifth semiconductor region.

In the semiconductor device, the ninth semiconductor region has an impurity concentration of the first conductivity type higher than that of the fourth semiconductor region.

In the semiconductor device, the ninth semiconductor region has an impurity concentration of the second conductivity type higher than that of the fourth semiconductor region.

In the semiconductor device, the fourth semiconductor region is a portion of the third semiconductor region.

The semiconductor device further includes a tenth semiconductor region of the second conductivity type selectively provided in the surface layer of the first principal surface of the semiconductor substrate to be away from the first semiconductor region and the fourth semiconductor region; an eleventh semiconductor region of the second conductivity type selectively provided to penetrate the tenth semiconductor region in the depth direction and to be at a depth equal to or deeper than a depth of the tenth semiconductor region; and a twelfth semiconductor region of the second conductivity type selectively provided in a surface layer of the eleventh semiconductor region, the twelfth semiconductor region having an impurity concentration that is higher than that of the eleventh semiconductor region. A first avalanche voltage of a first diode constituted by the semiconductor substrate and the third semiconductor region is higher than a second avalanche voltage of a second diode constituted by the semiconductor substrate and the eleventh semiconductor region.

In the semiconductor device, on a surface of the first principal surface of the semiconductor substrate, a first distance between the semiconductor substrate and the sixth semiconductor region is larger than a second distance between the semiconductor substrate and the eleventh semiconductor region.

According to yet another aspect of the present invention, a method of manufacturing a semiconductor device including a first semiconductor region of a second conductivity type selectively provided in a surface layer of a first principal surface of a semiconductor substrate of a first conductivity type; an element structure of a semiconductor element provided in the first semiconductor region; a second semiconductor region of the first conductivity type selectively provided in the first semiconductor region, the second semiconductor region constituting the element structure of the semiconductor element; a third semiconductor region of the second conductivity type selectively provided to penetrate the first semiconductor region in a depth direction and to surround the element structure of the semiconductor element at a depth equal to or deeper than a depth of the first semiconductor region, the third semiconductor region having an impurity concentration that is higher than that of the first semiconductor region; a fourth semiconductor region of the second conductivity type selectively provided in the surface layer of the first principal surface of the semiconductor substrate to be away from the first semiconductor region; a fifth semiconductor region of the first conductivity type selectively provided in the fourth semiconductor region; a sixth semiconductor region of the second conductivity type selectively provided to penetrate the fourth semiconductor region in the depth direction and to be at a depth equal to or deeper than a depth of the fourth semiconductor region, the sixth semiconductor region having an impurity concentration that is higher than that of the fourth semiconductor region; a first electrode that is electrically connected to the second semiconductor region, the third semiconductor region, the fourth semiconductor region, and the fifth semiconductor region; and a second electrode that is connected to a second principal surface of the semiconductor substrate, includes selectively forming the first semiconductor region and the fourth semiconductor region to be away from each other in the surface layer of the first principal surface of the semiconductor substrate at a same impurity implantation and impurity diffusion process; selectively forming the second semiconductor region in the first semiconductor region and selectively forming the fifth semiconductor region in the fourth semiconductor region at a same impurity implantation and impurity diffusion process; and selectively forming the third semiconductor region that penetrates the first semiconductor region in the depth direction and selectively forming the sixth semiconductor region that penetrates the fourth semiconductor region in the depth direction at a same impurity implantation and impurity diffusion process.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a plan diagram of a planar layout of the semiconductor device according to the first embodiment;

FIG. 3 is an explanatory diagram for explaining an operation principle of the semiconductor device according to the first embodiment;

FIG. 4 is a characteristics diagram of a snapback property of the semiconductor device according to the first embodiment;

FIG. 5 is a cross-sectional diagram of a structure of a semiconductor device according to a second embodiment;

FIG. 7 is a cross-sectional diagram of a structure of a semiconductor device according to a fourth embodiment;

FIG. 8 is a plan diagram of a planar layout of a protective element portion of the semiconductor device according to the fourth embodiment;

FIGS. 10A, 10B, 10C, 10D, and 10E are cross-sectional diagrams of a structure of a semiconductor device according to a fifth embodiment;

DETAILED DESCRIPTION OF THE INVENTION

Figure 1:
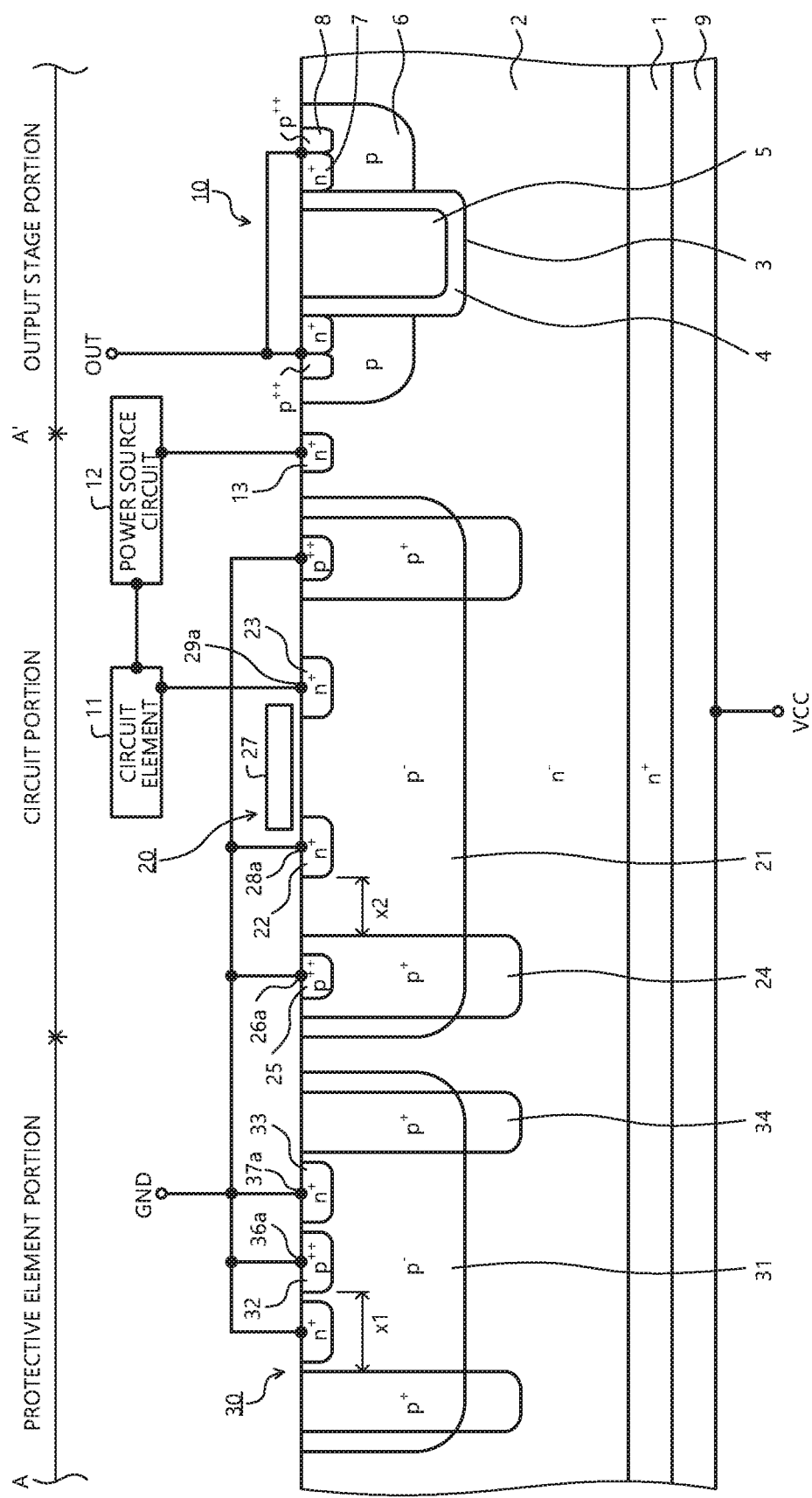
FIG. 1 is a cross-sectional diagram of a structure of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A structure of a semiconductor device according to a first embodiment will be described. FIG. 1 is a cross-sectional diagram of a structure of the semiconductor device according to the first embodiment. FIG. 1 depicts a cross-sectional view taken along a cutting line A-A' in FIG. 2. FIG. 2 is a plan diagram of a planar layout of the semiconductor device according to the first embodiment. FIG. 2 does not depict the planar layout of an output stage portion (similarly in FIGS. 15 and 18). The planar layout refers to the planar shapes and the arrangement configurations of the components as seen from a front surface side of a semiconductor substrate 100.

As an example of the semiconductor device according to the first embodiment, FIG. 1 depicts an in-vehicle, high-side power IC that has a vertical n-channel power MOSFET for the output stage, a horizontal CMOS for a control circuit, and a protective element 30 protecting these MOSFETs from surges, provided on a single semiconductor substrate (a semiconductor chip). In the circuit portion, only a horizontal n-channel MOSFET 20 is depicted of a horizontal p-channel MOSFET and the horizontal n-channel MOSFET complementarily connected to each other to constitute the horizontal CMOS for the control circuit.

For example, as depicted in FIG. 1, an output stage portion, the circuit portion, and a protective element portion are arranged away from each other on an n-type epitaxial base substrate (the semiconductor substrate) formed by depositing an n$^-$-type epitaxial layer 2 on the front surface of an n$^+$-type supporting substrate 1. In the output stage portion, for example, a vertical MOSFET 10 having a trench gate structure is arranged as a vertical n-channel power MOSFET for the output stage. In the output stage portion, the n$^+$-type supporting substrate 1 and the n$^-$-type epitaxial layer 2 respectively function as a drain layer and a drift layer of the vertical MOSFET 10. A MOS gate structure of the vertical MOSFET 10 is provided on the front surface side of the base substrate (on the opposite side of the n$^-$-type epitaxial layer 2 from the N$^+$-type supporting substrate 1 side).

The MOS gate structure of the vertical MOSFET 10 is a general trench gate structure that includes a trench 3, a gate insulating film 4, a gate electrode 5, p-type base regions 6, an n$^+$-type source region 7, and a p$^{++}$-type contact region 8. The planar layout of the MOS gate structure of the vertical MOSFET 10 is not depicted. The n$^+$-type source region 7 and the p$^{++}$-type contact region 8 are connected to a source electrode (a source terminal), and the source terminal is electrically connected to an output terminal provided on the front surface side of the base substrate through a wiring layer (not depicted). A drain electrode (a drain terminal (a second electrode)) 9 of the vertical MOSFET 10 connected to the rear surface of the base substrate (the rear surface of the n$^+$-type supporting substrate 1) is, for example, a power source voltage potential VCC terminal.

As depicted in FIGS. 1 and 2, in the circuit portion, a horizontal CMOS for the control circuit, the circuit elements 11, and circuits such as a power source circuit 12 are provided. For example, in the circuit portion, a p$^-$-type base region (a first semiconductor region) 21 is selectively provided in the surface layer on the front surface of the base substrate and, in the p$^-$-type base region 21, an n$^+$-type source region (a second semiconductor region) 22 and an n$^+$-type drain region (an eighth semiconductor region) 23 of the horizontal n-channel MOSFET 20 constituting the horizontal CMOS for the control circuit are selectively provided away from each other. The depths of the n$^+$-type source region 22 and the n$^+$-type drain region 23 may be, for example, equal to the depth of the n$^+$-type source region 7 of the vertical MOSFET 10.

A gate electrode 27 is provided through a gate insulating film (not depicted) on the surface of a portion of the p$^-$-type base region 21 between the n$^+$-type source region 22 and the n$^+$-type drain region 23. The gate electrode 27 is provided in, for example, a straight-line planar layout. In FIG. 2, electrodes other than the gate electrode 27 (the wiring layer) are not depicted. A p$^+$-type diffusion region (a third semiconductor region) 24 is provided that penetrates the p$^-$-type base region 21 in the depth direction and that reaches a portion of the n$^-$-type epitaxial layer 2 between the p$^-$-type base region 21 and the n$^+$-type supporting substrate 1. The p$^+$-type diffusion region 24 is provided in a vicinity of an outer periphery of the p$^-$-type base region 21 away from the n$^+$-type source region 22 and the n$^+$-type drain region 23 of the horizontal n-channel MOSFET 20.

The p$^+$-type diffusion region 24 is provided in, for example, a substantially rectangular frame planar layout surrounding the periphery of the horizontal n-channel MOSFET 20. On the inner side of the p$^+$-type diffusion region 24, plural unit cells (each a functional unit of the element) of the horizontal n-channel MOSFET 20 may be arranged. The p$^+$-type diffusion region 24 has a depth that is deeper than the depth of the p$^-$-type base region 21, and protrudes from the lower side of the p$^-$-type base region 21 (the n$^+$-type supporting substrate 1 side) into the n$^-$-type epitaxial layer 2. The p$^+$-type diffusion region 24 functions as an anti-inversion layer that prevents inversion of the p$^-$-type base region 21 caused by the potential of the wiring layer (not depicted) deposited on the front surface of the base substrate. The p$^+$-type diffusion region 24 functions as a guard ring that prevents the horizontal n-channel MOSFET 20 from being affected by a device adjacent to the horizontal n-channel MOSFET 20 such as being affected by noise.

In the p$^+$-type diffusion region 24, a p$^{++}$-type contact region 25 is selectively provided that is in ohmic contact with the wiring layer (not depicted). The p$^{++}$-type contact region 25 is provided in, for example, a rectangular frame planar layout surrounding the periphery of the horizontal n-channel MOSFET 20. The depth of the p$^{++}$-type contact region 25 may be, for example, equal to the depth of the p$^{++}$-type contact region 8 of the vertical MOSFET 10. For the snapback property of a parasitic bipolar element T2 of the circuit portion described later, a parasitic bipolar element T1 of the protective element portion merely has to have a predetermined snapback property (see FIG. 4), and the p$^{++}$-type contact region 25 may be omitted depending on the impurity concentration of the p$^+$-type diffusion region 24.

FIGS. 1 and 2 each depict an example of a case where the horizontal n-channel MOSFET 20 is used in each of various types of inverter circuits such as a CMOS inverter, an ED inverter, and a resistance load inverter that constitute the control circuit in the circuit portion (similarly in FIGS. 3, 5, 11, 12, 14, 15, 17 to 19, 21, and 23). The source electrode (the source terminal (a first electrode)) connected to the n$^+$-type source region 22 of the horizontal n-channel MOSFET 20 is electrically connected to a GND terminal (a GND pad) at the ground potential that is provided on the front surface of the base substrate. For example, one contact hole 28b constituting a contact portion 28a between the n$^+$-type source region 22 and the wiring layer at a source potential (the source electrode) is arranged to have a substantially rectangular planar shape.

The p$^-$-type base region 21 to be a back gate is electrically connected to the GND terminal through the p$^+$-type diffusion region 24, the p$^{++}$-type contact region 25, and the wiring layer (not depicted). For example, plural contact holes 26b each constituting a contact portion 26a between the p$^{++}$-type contact region 25 and the wiring layer of the horizontal n-channel MOSFET 20, each have a substantially rectangular planar shape and are provided to be scattered along the periphery direction of the p$^{++}$-type contact region 25. The n$^+$-type drain region 23 of the horizontal n-channel MOSFET 20 is connected to the circuit elements 11 such as the horizontal p-channel MOSFET, a depletion MOSFET, and a resistive element through the drain electrode (the drain element).

The circuit elements 11 are connected to the drain terminal of the horizontal n-channel MOSFET 20 and thereby constitute the various types of inverter circuits. For example, one contact hole 29b constituting a contact portion 29a between the n$^+$-type drain region 23 and the wiring layer at a drain potential (the drain electrode) of the horizontal n-channel MOSFET 20 is arranged to have a substantially rectangular planar shape. The circuit elements 11 are connected to a high potential-side n$^+$-type diffusion region 13 selectively provided in the surface layer of the front surface of the base substrate through the power source circuit 12. The power source circuit 12 includes a high voltage circuit element (not depicted), receives a power source potential of the n-type epitaxial base substrate (the potential of the VCC terminal), outputs a low potential to the circuit elements 11, and thereby supplies the power source voltage to the various types of inverter circuits.

As depicted in FIGS. 1 and 2, the protective element portion has the protective element 30 arranged therein that includes the vertical diode. In the protective element portion, a p$^-$-type diffusion region (a fourth semiconductor region) 31 is selectively provided away from the p$^-$-type base region 21 of the circuit portion in the surface layer of the front surface of the base substrate. In the p$^-$-type diffusion region 31, a p$^{++}$-type contact region (a seventh semiconductor region) 32, an n$^+$-type diffusion region (a fifth semiconductor region) 33, and a p$^+$-type diffusion region (a sixth semiconductor region) 34 are each selectively provided. The p$^{++}$-type contact region 32 is arranged in a substantially central portion of the p$^-$-type diffusion region 31. The p$^{++}$-type contact region 32 is in ohmic contact with the wiring layer 35. An n$^+$-type diffusion region 33 is arranged in a substantially rectangular ring planar layout surrounding the periphery of the p$^{++}$-type contact region 32.

The p$^+$-type diffusion region 34 penetrates, in the depth direction, the p$^-$-type diffusion region 31 near the outer periphery of the p$^-$-type diffusion region 31 and reaches a portion between the p$^-$-type diffusion region 31 and the n$^+$-type supporting substrate 1. The p$^+$-type diffusion region 34 is arranged, for example, more outwardly than the n$^+$-type diffusion region 33 in a substantially rectangular ring planar layout to surround the periphery of the n$^+$-type diffusion region 33. The n$^+$-type diffusion region 33 is arranged between the p$^+$-type diffusion region 34 and the p$^{++}$-type contact region 32. The n$^+$-type diffusion region 33 may be in contact with the p$^{++}$-type contact region 32 or may be arranged away from the p$^{++}$-type contact region 32. The p$^+$-type diffusion region 34 may be in contact with the n$^+$-type diffusion region 33 or may be arranged away from the n$^+$-type diffusion region 33. The depth of the p$^+$-type diffusion region 34 is deeper than the depth of the p$^-$-type diffusion region 31, and a pn-junction between the p$^+$-type diffusion region 34 and the n$^-$-type epitaxial layer 2 constitutes the vertical diode.

Preferably, the depths of the p$^-$-type diffusion region 31, the p$^{++}$-type contact region 32, the n$^+$-type diffusion region 33, and the p$^+$-type diffusion region 34 are, for example, respectively equal to the depths of the p$^-$-type base region 21, the p$^{++}$-type contact region 25, the n$^+$-type source region 22, and the p$^+$-type diffusion region 24 of the circuit portion. The reason for this is that the diffusion regions of the protective element portion may be formed by the same impurity implantation and impurity diffusion step (the impurity implantation and impurity diffusion process) as that for the diffusion regions arranged in the circuit portion, whose conductivity types, impurity concentrations, and depths are same as/equal to those of these diffusion regions of the protective element. Thus, even when the process variation occurs, the extent of variation of the diffusion regions tends to be the same in the protective element portion and the circuit portion. The protective element portion and the circuit portion can each therefore be adjusted to have a predetermined operation property. The cost can be suppressed because no new step needs to be added to form the protective element portion and the circuit portion on the single semiconductor substrate.

The p$^{++}$-type contact region 32 and the n$^+$-type diffusion region 33 are connected to the GND terminal through the wiring layer 35. One or more contact hole(s) 36b and one or more contact hole(s) 37b are arranged for the p$^{++}$-type contact region 32 and the n$^+$-type diffusion region 33 to constitute the contact portions 36a and 37a to be in contact with the wiring layer 35. FIG. 2 depicts a state where the contact holes 36b and 37b are each arranged in plural (black rectangular portions). Preferably, the number of the contact holes 37b for the n$^+$-type diffusion region 33 of the protective element portion to constitute the contact portions 37a in contact with the wiring layer 35 is greater than the number of the contact holes 28b constituting the contact portions 28a in contact with the n$^+$-type source region 22 of the circuit portion and the wiring layer (not depicted) at the source potential (the ground potential). Preferably, the area of the pn-junction formed by the n$^+$-type diffusion region 33 and the p$^-$-type diffusion region 31 of the protective element portion is larger than the area of the pn-junction formed by the n$^+$-type source region 22 and the p$^-$-type base region 21 of the circuit portion. The breakdown current amount of the parasitic bipolar element T1 of the protective element portion can be increased more than that of the parasitic bipolar element T2 of the circuit portion by causing the number of the contact holes 37b, or the area of the pn-junction of the n$^+$-type diffusion region 33 and the p$^-$-type diffusion region 31, or both of these to satisfy the above conditions in the protective element portion. For the snapback property of the parasitic bipolar element T2 of the circuit portion described later, the parasitic bipolar element T1 of the protective element portion merely has to have a predetermined snapback property (see FIG. 4), and the p$^{++}$-type contact region 32 may be omitted depending on the impurity concentration of the p$^-$-type diffusion region 31. In this case, the contact hole 37b is formed to be in contact with the wiring layer 35, in a substantially central portion surrounded by the n$^+$-type diffusion region 33, of the p$^-$-type diffusion region 31.

Operations of the semiconductor device according to the first embodiment will be described. FIG. 3 is an explanatory diagram for explaining the operation principle of the semiconductor device according to the first embodiment. FIG. 4 is a characteristics diagram of a snapback property of the semiconductor device according to the first embodiment. As depicted in FIG. 3, vertical diodes D1 and D2 are formed by the pn-junctions between the p$^+$-type diffusion regions 34 and 24, and the n$^-$-type epitaxial layer 2 respectively in the protective element portion and the circuit portion. An operation of the circuit portion executed in a case where the circuit portion is present alone will be described with reference to an operation principle diagram of FIG. 3 and a current-voltage (I-V) waveform w2 of FIG. 4. When a surge voltage intrudes from the VCC terminal, the voltage of the VCC terminal is thereby increased, and the voltage applied to the circuit portion reaches a first voltage (hereinafter, referred to as "breakdown voltage") Vbv2, the vertical diode D2 breaks down at the pn-junction between the p$^+$-type diffusion region 24 and the n$^-$-type epitaxial layer 2, and a current (an avalanche current) I2 starts to flow therethrough. Positive carriers (holes) generated in the vertical diode D2 due to the avalanche current I2 pass through the p$^+$-type diffusion region 24 and flow from the p$^{++}$-type contact region 25 into the GND terminal through the wiring layer. The point of the breakdown of the vertical diode D2 spreads over the entire surface of the pn-junction face between the p$^+$-type diffusion region 24 and the n$^-$-type epitaxial layer 2 and the region in which the carriers are generated also spreads out as the voltage applied to the circuit portion is increased and the avalanche current I2 is increased. Associated with this, the avalanche current I2 flows over a long distance until the avalanche current I2 reaches the p$^{++}$-type contact region 25 and, in the p$^+$-type diffusion region 24, the voltage drop thereof becomes significant due to the resistive components corresponding to the distance from the point of the breakdown to the p$^{++}$-type contact region 25. When the voltage applied to the circuit portion is further increased to a second voltage Vt2 and the avalanche current I2 is increased up to a predetermined current It2, the voltage drop in the p$^+$-type diffusion region 24 exceeds a forward voltage of the pn-junction between the p$^-$-type base region 21 and the n$^+$-type source region 22. The pn-junction between the p$^-$-type base region 21 and the n$^+$-type source region 22 is forward-biased and a current I2a that is a component of the avalanche current I2 flows toward the n$^+$-type source region 22 side. The current I2a flowing toward the n$^+$-type source region 22 side becomes a base current, and the parasitic bipolar element T2 including the n$^+$-type source region 22, the p$^-$-type base region 21, and the n$^-$-type epitaxial layer 2 is turned on to snap back. In this case, the voltage applied to the circuit portion is reduced to a voltage Vh2 that is lower than the breakdown voltage Vbv2 of the vertical diode D2.

An operation of the protective element portion executed in a case where the protective element portion is present alone will be described with reference to the operation principle diagram in FIG. 3 and an I-V waveform w1 in FIG. 4. When a surge voltage intrudes from the VCC terminal, the voltage of the VCC terminal is thereby increased, and the voltage applied to the protective element portion reaches a first voltage (the breakdown voltage) Vbv1, the vertical diode D1 breaks down at the pn-junction between the p$^+$-type diffusion region 34 and the n$^-$-type epitaxial layer 2, and an avalanche current I1 starts to flow therethrough. Positive carriers (holes) generated in the vertical diode D1 due to the avalanche current I1 pass through the p$^+$-type diffusion region 34 and the p$^-$-type diffusion region 31, and flow from the p$^{++}$-type contact region 32 into the GND terminal through the wiring layer 35. The operation resistance of the vertical diode D1 is relatively large due to a resistive component R1 by the p$^-$-type diffusion region 31. When the voltage applied to the protective element portion is further increased up to a second voltage Vt1 and the avalanche current I1 is increased up to a predetermined current It1, the voltage drop in the p$^-$-type diffusion region 31 due to the resistive component R1 by the p$^-$-type diffusion region 31 exceeds a forward voltage of the pn-junction between the p$^-$-type diffusion region 31 and the n$^+$-type diffusion region 33. The pn-junction between the p$^-$-type diffusion region 31 and the n$^+$-type diffusion region 33 is forward-biased and a current I1a that is a portion of the avalanche current I1 flows toward the n$^+$-type diffusion region 33 side. The current I1a flowing toward the n$^+$-type diffusion region 33 side becomes a base current, and the parasitic bipolar element T1 including the n$^+$-type diffusion region 33, the p$^-$-type diffusion region 31, and the n$^-$-type epitaxial layer 2 is turned on to snap back. In this case, the voltage applied to the protective element portion is reduced to a voltage Vh1 that is lower than the breakdown voltage Vbv1 of the vertical diode D1. In FIG. 3, reference numerals "I1b" and "I2b" denote the avalanche currents each flowing into the GND terminal through the wiring layer 35.

The vertical diode D1 of the protective element portion and the vertical diode D2 of the circuit portion are compared. As to the vertical diodes D1 and D2, the breakdown voltages Vbv1 and Vbv2 thereof are equal to each other because the conditions (the impurity concentration and the diffusion depth) are substantially equal for the p$^+$-type diffusion regions 34 and 24 constituting the pn-junctions of the vertical diodes D1 and D2. On the other hand, the protective element portion and the circuit portion differ from each other on the following two points. The first point is as follows. In the circuit portion, the carriers generated in the vertical diode D2 due to the avalanche current I2 pass through only the p$^+$-type diffusion region 24 and reach the p$^{++}$-type contact region 25. In contrast, in the protective element portion, the carriers generated in the vertical diode D1 due to the avalanche current I1 pass through the p$^-$-type diffusion region 31 whose impurity concentration is lower than that of the p$^+$-type diffusion region 34 and reach the p$^{++}$-type contact region 32. The operation resistance of the vertical diode D1 of the protective element portion therefore becomes higher than the operation resistance of the vertical diode D2 of the circuit portion. The slope of the avalanche current I1 between the first voltage Vbv1 and the second voltage Vt1 of the I-V waveform w1 of the protective element portion thereby becomes more gradual than the slope of the avalanche current I2 between the first voltage Vbv2 and the second voltage Vt2 of the I-V waveform w2 of the circuit portion. With applied voltages equal to or higher than the breakdown voltages Vbv1 and Vbv2, the increased amount of the avalanche current I1 of the vertical diode D1 of the protective element portion becomes smaller than the increased amount of the avalanche current I2 of the vertical diode D2 of the circuit portion.

The second point is as follows. In the protective element portion, different from the circuit portion, the n$^+$-type diffusion region 33 is arranged at the position between the p$^+$-type diffusion region 34 and the p$^{++}$-type contact region 32. The pn-junction between the p$^-$-type diffusion region 31 and the n$^+$-type diffusion region 33 is therefore present in the vicinity of the route for a large portion of the avalanche current I1 flowing through the protective element portion to flow into the wiring layer 35. The pn-junction between the p$^-$-type diffusion region 31 and the n$^+$-type diffusion region 33 tends to be forward-biased due to the avalanche current I1 and, with the influence of the high operation resistance of the vertical diode D1 in addition, the parasitic bipolar element T1 of the protective element portion more easily snaps back than the parasitic bipolar element T2 of the circuit portion. The current It1 flowing at the start of the snapping back of the parasitic bipolar element T1 of the protective element portion is smaller than the current It2 flowing at the start of the snapping back of the parasitic bipolar element T2 of the circuit portion (It1<It2). In this case, the second voltage Vt1 for the parasitic bipolar element T1 of the protective element portion to start snapping back (hereinafter, referred to as "snapback start voltage") is set to be lower than the second voltage Vt2 for the parasitic bipolar element T2 of the circuit portion to start snapping back (hereinafter, referred to as "snapback start voltage") (Vt1<Vt2). Adjustment of the snapback start voltages Vt1 and Vt2 can be realized by adjusting the resistive component R1 by the p$^-$-type diffusion region 31. For example, the adjustment of the snapback start voltages Vt1 and Vt2 may be executed by adjusting the impurity concentration of the p$^-$-type diffusion region 31 in the protective element portion, may be executed by adjusting a distance x1 from the p$^+$-type diffusion region 34 to the p$^{++}$-type contact region 32, may be executed by adjusting the distance from the p$^+$-type diffusion region 34 to the n$^+$-type diffusion region 33, or may be executed by jointly adjusting these conditions.

Figure 13:
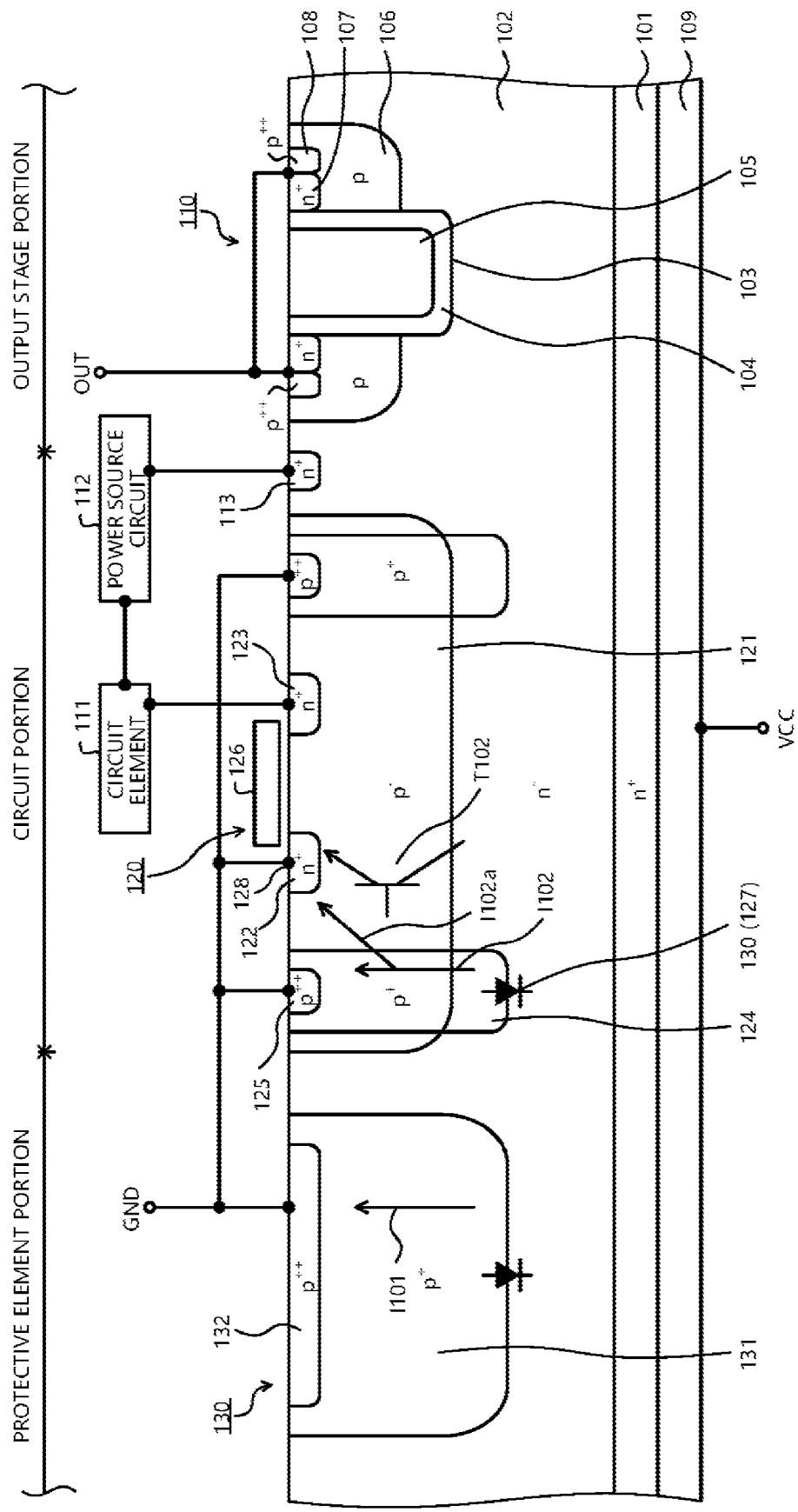
FIG. 13 is a cross-sectional diagram of a structure of a traditional semiconductor device.

The circuit portion and the protective element portion having the above properties are arranged in a single semiconductor substrate. In a case where the surge voltage intrudes from the VCC terminal, when the voltage applied to the circuit portion is increased up to the snapback start voltage Vt1 of the parasitic bipolar element T1 of the protective element, the parasitic bipolar element T1 snaps back and the surge current is absorbed by the protective element portion. Even when the surge voltage intrudes from the VCC terminal, the parasitic bipolar element T2 of the circuit portion does not snap back. Even when the width of the contact hole 28b constituting the contact portion 28a between the n$^+$-type source region 22 and the wiring layer of the horizontal n-channel MOSFET 20 is reduced due to size reductions, no current concentrates at the contact hole 28b and no breakdown therefore occurs. On the other hand, in the protective element portion, when the footprint of the p$^-$-type diffusion region 31 is ensured to be substantially the same as that of the p$^+$-type diffusion region 131 of the traditional case (see FIG. 13), more of the contact holes 36b and 37b, or one contact hole 36b and one contact hole 37b each having a large width, constituting the contact portions 36a and 37a in contact with the wiring layer 35 may be arranged. The breakdown current of each of the contact holes 36b and 37b may thereby be increased, the contact holes 36b and 37b are therefore not rapidly broken by the snapping back of the parasitic bipolar element T1 of the protective element portion, and the breakdown current amount of the protective element portion may be improved. The surge tolerance of the power IC may therefore be improved even when size reduction is facilitated.

As described, according to the first embodiment, the operation resistance of the vertical diode of the protective element portion may be configured to be higher than the operation resistance of the vertical diode of the circuit portion by providing the p$^+$-type diffusion region that penetrates the p$^-$-type diffusion region in the depth direction of the protective element portion and whose depth is equal to or larger than that of the p$^-$-type diffusion region, and by providing the n$^+$-type diffusion region at the GND potential between the p$^+$-type diffusion region and the p$^{++}$-type contact region. A surge current may thereby be absorbed by the protective element portion when a surge voltage is applied. Concentration of the surge current may be suppressed at the contact portion between the n$^+$-type source region and the wiring layer of the horizontal n-channel MOSFET of the circuit portion even when the width of the contact hole constituting the contact portion between the n$^+$-type source region and the wiring layer of the horizontal n-channel MOSFET is reduced due to size reductions. The surge tolerance of the overall power IC may be increased.

According to the first embodiment, the diffusion regions of the protective element portion may be formed concurrently with the diffusion regions of the circuit portion having the same impurity concentrations and the same depths as those of the above diffusion regions at the same impurity implantation and impurity diffusion step, and no new step therefore needs to be added, enabling increases in cost to be suppressed. According to the first embodiment, the protective element portion and the circuit portion have the same diffusion layer configuration by concurrently forming the diffusion regions of the protective element portion and the diffusion regions of the circuit portion at the same impurity implantation and impurity diffusion step, and variation of the snapback start current of the parasitic bipolar element due to process variation tends to be the same in the protective element portion and the circuit portion. The balance of the magnitude relation of the currents each flowing at the start of the snapping back of the parasitic bipolar element is therefore maintained in the protective element portion and the circuit portion, and stable protection operation is enabled against process variation.

A structure of a semiconductor device according to a second embodiment will be described. FIG. 5 is a cross-sectional diagram of a structure of the semiconductor device according to the second embodiment. FIG. 5 depicts a state during the operation of the semiconductor device according to the second embodiment (similarly in FIG. 6A, and FIGS. 11 and 12). The semiconductor device according to the second embodiment differs from the semiconductor device according to the first embodiment in that a width x11 of a p$^+$-type diffusion region 44 constituting the vertical diode D2 in the circuit portion is partially and inwardly increased. For example, the width x11 of the p$^+$-type diffusion region 44 is large to the extent that the width x11 reaches the n$^+$-type source region 22 from a vicinity of the outer periphery of the p$^-$-type base region 21, in the portion thereof that faces the n$^+$-type source region 22 of the horizontal n-channel MOSFET 20. The p$^+$-type diffusion region 44 may be arranged to overlap a portion of the n$^+$-type source region 22. The width x12 of the p$^{++}$-type contact region 45 selectively provided inside the p$^+$-type diffusion region 44 may be increased corresponding to the width x11 of the p$^+$-type diffusion region 44. The p$^{++}$-type contact region 45 may be in contact with the n$^+$-type source region 22.

Of the avalanche current I2, the current I2a flowing toward the $n^+$-type source region 22 side and passing through the low resistance $p^+$-type diffusion region 44 may be increased by increasing the width x11 of the $p^+$-type diffusion region 44 even when the region having the carriers generated therein spreads out due to an increase of the avalanche current I2 generated in a case where the vertical diode D2 breakdowns. An effect is therefore achieved that the current It2 for the parasitic bipolar element T2 of the circuit portion to start snapping back is increased and the snapback start voltage Vt2 of the parasitic bipolar element T2 of the circuit portion is increased (see FIG. 4). Establishment of a configuration may thereby be facilitated for the parasitic bipolar element T1 of the protective element portion to snap back sooner than the parasitic bipolar element T2 of the circuit portion when a surge voltage intrudes from the VCC terminal, and the degree of freedom of the design of the protective element portion is improved.

As described, according to the second embodiment, effects identical to those of the first embodiment may obtained.

Figure 6A:
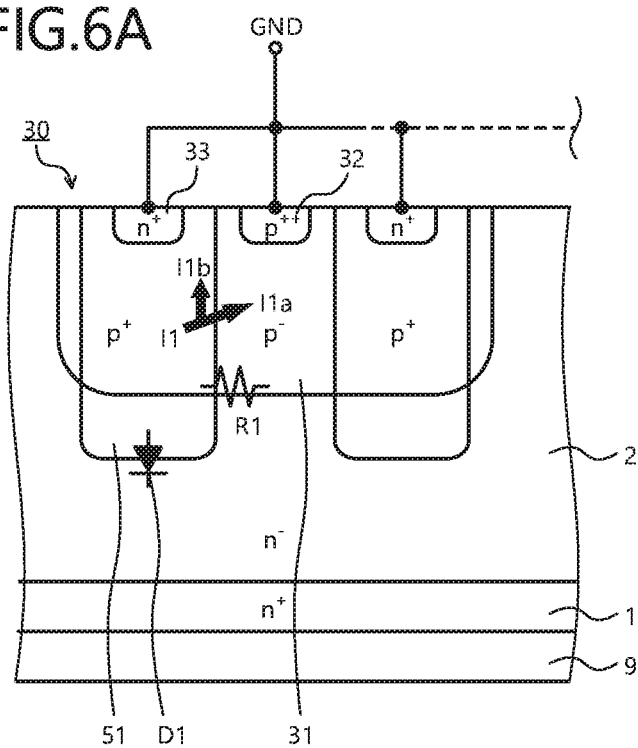
FIGS. 6A and 6B are cross-sectional diagrams of a structure of a semiconductor device according to a third embodiment.
Figure 6B:
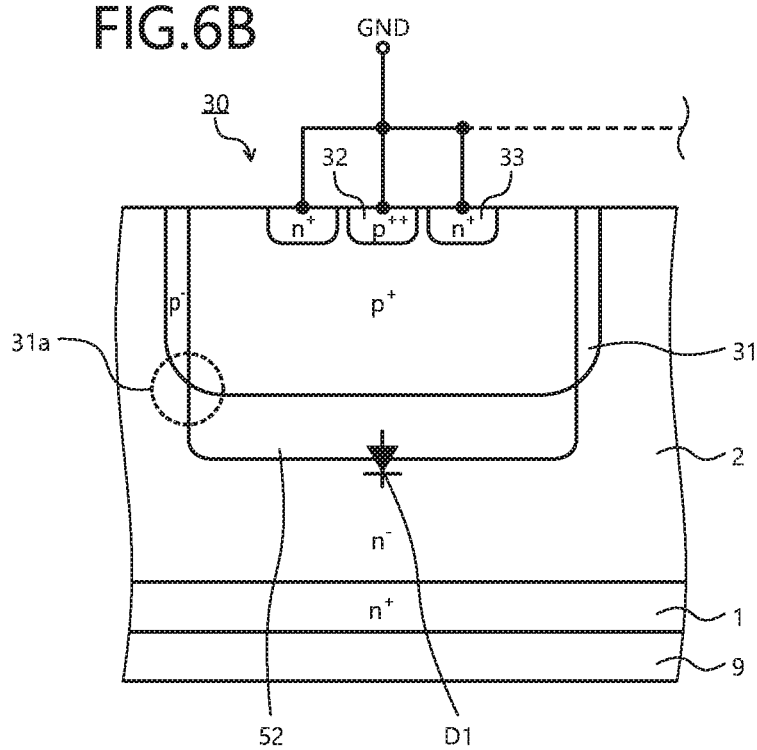

A structure of a semiconductor device according to a third embodiment will be described. FIGS. 6A and 6B are cross-sectional diagrams of a structure of the semiconductor device according to the third embodiment. FIGS. 6A and 6B depict the cross-sectional structure of the protective element portion and do not depict the circuit portion or the output stage portion that are formed on the same semiconductor substrate as that of the protective element portion. The configurations of the circuit portion and the output stage portion of the semiconductor device according to the third embodiment are same as those of the semiconductor device according to the first embodiment (see FIG. 1). The configurations of the circuit portion and the output stage portion of the semiconductor device according to the third embodiment may be same as those of the semiconductor device according to the second embodiment (see FIG. 5). The semiconductor device according to the third embodiment differs from the semiconductor device according to the first embodiment in that the $n^+$-type diffusion region 33 is arranged inside each of the $p^+$-type diffusion regions 51 and 52 each constituting the vertical diode D1 in the protective element portion. The $p^{++}$-type contact region 32 arranged in a substantially central portion of the $p^-$-type diffusion region 31 may be arranged away from the $p^+$-type diffusion region 51 (FIG. 6A) or may be arranged inside the $p^+$-type diffusion region 52 (FIG. 6B).

The resistive component R1 by the $p^-$-type diffusion region 31 and corresponding to the distance from the point of the breakdown of the vertical diode D1 to the $p^{++}$-type contact region 32 may be reduced by arranging the $n^+$-type diffusion region 33 in the $p^+$-type diffusion region 51 as depicted in FIG. 6A. The current It1 flowing at the start of the snapping back of the parasitic bipolar element of the protective element portion may therefore be increased corresponding to the reduction amount of the resistive component R1 by the $p^-$-type diffusion region 31. The snapback start voltage Vt1 of the parasitic bipolar element of the protective element portion may be increased corresponding to the reduction amount of the resistive component R1 by the $p^-$-type diffusion region 31. Malfunction such as the snapping back of the parasitic bipolar element of the protective element portion due to noise may thereby be avoided (see FIG. 4). Noise is, for example, an abnormal voltage that is a low voltage compared to a surge voltage and that may cause malfunction of the IC. The adjustment of the snapback start voltage (the second voltage) Vt1 may be executed by adjusting the impurity concentration of the $p^-$-type diffusion region 31, may be executed by adjusting the distance from the $p^+$-type diffusion region 51 to the $p^{++}$-type contact region 32, or may be executed by jointly adjusting these conditions, in the protective element portion.

As depicted in FIG. 6B, the $p^+$-type diffusion region 52 may be arranged to substantially overlap the $p^-$-type diffusion region 31, and the $p^{++}$-type contact region 32 and the $n^+$-type diffusion region 33 may be arranged in the $p^+$-type diffusion region 52. FIG. 6B depicts the $p^+$-type diffusion region 52 whose width is large to the extent to overlap with both corner portions 31a of the $p^-$-type diffusion region 31. The resistive component (not depicted) by the $p^-$-type diffusion region 31 may thereby be further reduced and malfunction due to noise may be avoided. The adjustment of the snapback start voltage Vt1 may be executed by adjusting the impurity concentration of each of the $p^-$-type diffusion region 31 and the $p^+$-type diffusion region 52 in the protective element portion.

As described, according to the third embodiment, effects identical to those of the first and second embodiments may be obtained.

Figure 9:
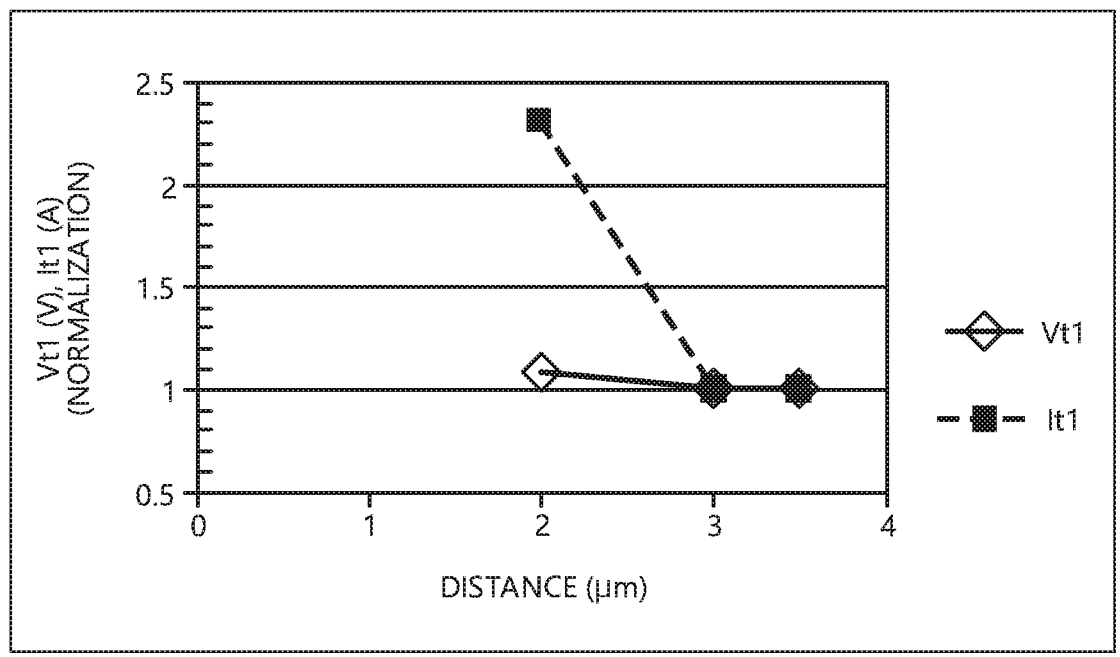
FIG. 9 is a characteristics diagram of a snapback property of the protective element portion of the semiconductor device according to the fourth embodiment.

A structure of a semiconductor device according to a fourth embodiment will be described. FIG. 7 is a cross-sectional diagram of a structure of the semiconductor device according to the fourth embodiment. FIG. 7 depicts the cross-sectional structure of the protective element portion in FIG. 8 and does not depict the circuit portion or the output stage portion that are formed on the same semiconductor substrate as that of the protective element portion. FIG. 8 is a plan diagram of the planar layout of the protective element portion of the semiconductor device according to the fourth embodiment. FIG. 8 does not depict the planar layouts of the circuit portion and the output stage portion (the same is applied to FIG. 20). FIG. 9 is a characteristics diagram of the snapback property of the protective element portion of the semiconductor device according to the fourth embodiment. The configurations of the circuit portion and the output stage portion of the semiconductor device according to the fourth embodiment are same as those of the semiconductor device according to the first embodiment (see FIG. 1). The semiconductor device according to the fourth embodiment differs from the semiconductor device according to the first embodiment in that the structure of the protective element portion is configured to be substantially same as the structure of the circuit portion.

For example, as depicted in FIGS. 7 and 8, the arrangement is different from that of the first embodiment with respect to a $p^{++}$-type contact region 62 and an $n^+$-type diffusion region 63 in contact with the wiring layer 35 connected to the GND terminal in the protective element portion. For example, the $n^+$-type diffusion region 63 is arranged in a substantially central portion of the $n^-$-type diffusion region 31. The $p^+$-type diffusion region 34 constituting the vertical diode D1 is arranged in a vicinity of the periphery of the $p^-$-type diffusion region 31, to be away from the $n^+$-type diffusion region 63 and to surround the periphery of the $n^+$-type diffusion region 63. The $p^{++}$-type contact region 62 is arranged in the $p^+$-type diffusion region 34. Reference numerals "66a" and "67a" denote contact portions of the $p^{++}$-type contact region 62 and the $n^+$-type diffusion region 63, with the wiring layer 35. Reference numerals "66b" and "67b" denote contact holes respectively for the $p^{++}$-type contact region 62 and the $n^+$-type diffusion region 63 to be in contact with the wiring layer 35 (black rectangular portions in FIG. 8).

As described, the $p^{++}$-type contact region 62, the $n^+$-type diffusion region 63, and the $p^+$-type diffusion region 34 of the protective element portion are arranged similarly to the $p^{++}$-type contact region 25, the $n^+$-type source region 22, and the $p^+$-type diffusion region 24 of the circuit portion. As depicted in FIG. 9, the current It1 and the snapback start voltage Vt1 at the start of the snapping back of the parasitic bipolar element T1 of the protective element portion may be adjusted by adjusting a distance x21 from the $p^+$-type diffusion region 34 to the $n^+$-type diffusion region 63 of the protective element portion. For example, the current It1 flowing at the start of the snapping back of the parasitic bipolar element T1 of the protective element portion is reduced and the snapping back tends to occur as the distance x21 from the $p^+$-type diffusion region 34 to the $n^+$-type diffusion region 63 of the protective element portion is increased. Similar to the first embodiment, the parasitic bipolar element T1 of the protective element portion may be caused to snap back sooner than the parasitic bipolar element T2 of the circuit portion by adjusting the distance x21 from the $p^+$-type diffusion region 34 to the $n^+$-type diffusion region 63 of the protective element portion (see FIG. 4). For example, the distance x21 from the $p^+$-type diffusion region 34 to the $n^+$-type diffusion region 63 of the protective element portion merely has to be configured to be larger than a distance x2 from the $p^+$-type diffusion region 24 to the $n^+$-type source region 22 of the circuit portion (see FIG. 1) (x21>x2). The adjustment of the snapback start voltage Vt1 may be executed by adjusting the impurity concentration of the $p^-$-type diffusion region 31 in the protective element portion.

The configuration of the circuit portion may be set to be the same configuration as that of the circuit portion of the semiconductor device according to the second embodiment (see FIG. 5, x2≤0).

As described, according to the fourth embodiment, effects identical to those of the first and second embodiments may be obtained.

Figure 10A:
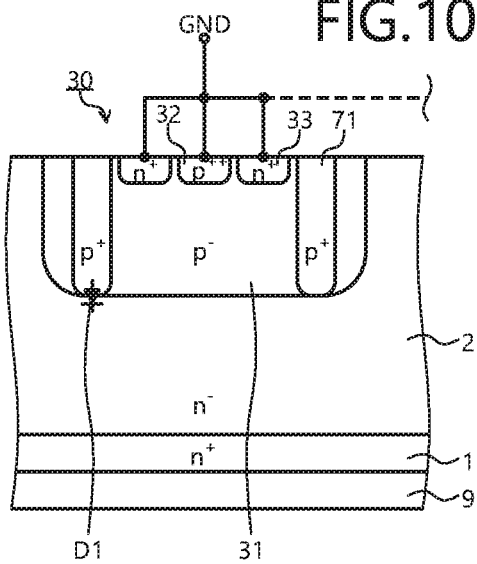

A structure of a semiconductor device according to a fifth embodiment will be described. FIGS. 10A, 10B, 10C, 10D, and 10E are cross-sectional diagrams of a structure of the semiconductor device according to the fifth embodiment. FIGS. 10A to 10E depict the cross-sectional structure of the protective element portion and do not depict the circuit portion or the output stage portion that are formed on the same semiconductor substrate as that of the protective element portion. The configurations of the circuit portion and the output stage portion of the semiconductor device according to the fifth embodiment are same as those of the semiconductor device according to the first embodiment (see FIG. 1). The configurations of the circuit portion and the output stage portion of the semiconductor device according to the fifth embodiment may be same as those of the semiconductor device according to the second embodiment (see FIG. 5). The semiconductor device according to the fifth embodiment differs from the semiconductor device according to the first embodiment in that the depth of the $p^+$-type diffusion region 71 constituting the vertical diode D1 in the protective element portion is set to be equal to the depth of the $p^-$-type diffusion region 31 (FIG. 10A). In the fifth embodiment, the point of the breakdown of the vertical diode D1 of the protective element portion is a pn-junction between the $p^+$-type diffusion region 71 and the $n^-$-type epitaxial layer 2.

Figure 10B:
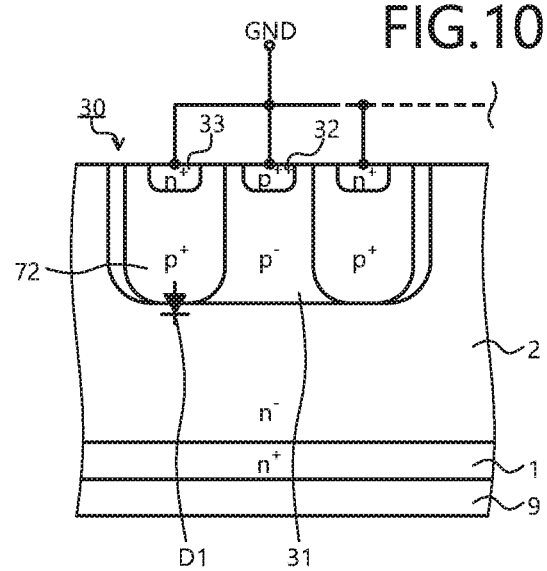

The time period of the heat treatment for diffusing the impurity may be reduced to form the $p^+$-type diffusion region 71 by setting the depth of the $p^+$-type diffusion region 71 to be substantially equal to the depth of the $p^-$-type diffusion region 31 to the extent that the avalanche breakdown occurs in the bottom portion of the $p^+$-type diffusion region 71. Diffusion in the lateral direction (the direction parallel to the front surface of the base substrate) of the $p^+$-type diffusion region 71 may thereby be suppressed, this is therefore advantageous for side reductions of the circuit, and the cost may be suppressed. A configuration may be employed to have the depths of the $p^+$-type diffusion regions 72 to 74 each constituting the point of the avalanche breakdown in the protective element portion configured to be equal to the depth of the $p^-$-type diffusion region 31 by applying the fifth embodiment to the third and the fourth embodiments (FIG. 10B to FIG. 10D). FIGS. 10B and 10C each depict a case where the fifth embodiment is applied to the semiconductor device according to the third embodiment (see FIGS. 6A and 6B). FIG. 10D depicts a case where the fifth embodiment is applied to the semiconductor device according to the fourth embodiment (see FIG. 7).

FIG. 10E depicts a modification of FIG. 10A. In the modification depicted in FIG. 10E, the depth of the $p^+$-type diffusion region 71 is slightly shallower than the depth of the $p^-$-type diffusion region 31. In this case, an effect identical to that of the configuration depicted in FIG. 10A is achieved by forming the $p^+$-type diffusion region 71 such that the point of the avalanche breakdown of the protective element portion is positioned at the bottom of the $p^-$-type diffusion region 71. The depth of the $p^+$-type diffusion region 71 merely has to be a depth with which the breakdown voltage of the protective element is determined by the bottom portion of the $p^+$-type diffusion region 71.

In FIGS. 10B, 10C, and 10D, similarly, the depth of the $p^+$-type diffusion region 71 may be slightly shallower than the depth of the $p^-$-type diffusion region 31.

As described, according to the fifth embodiment, effects identical to those of the first to fourth embodiments may be obtained.

Figure 11:
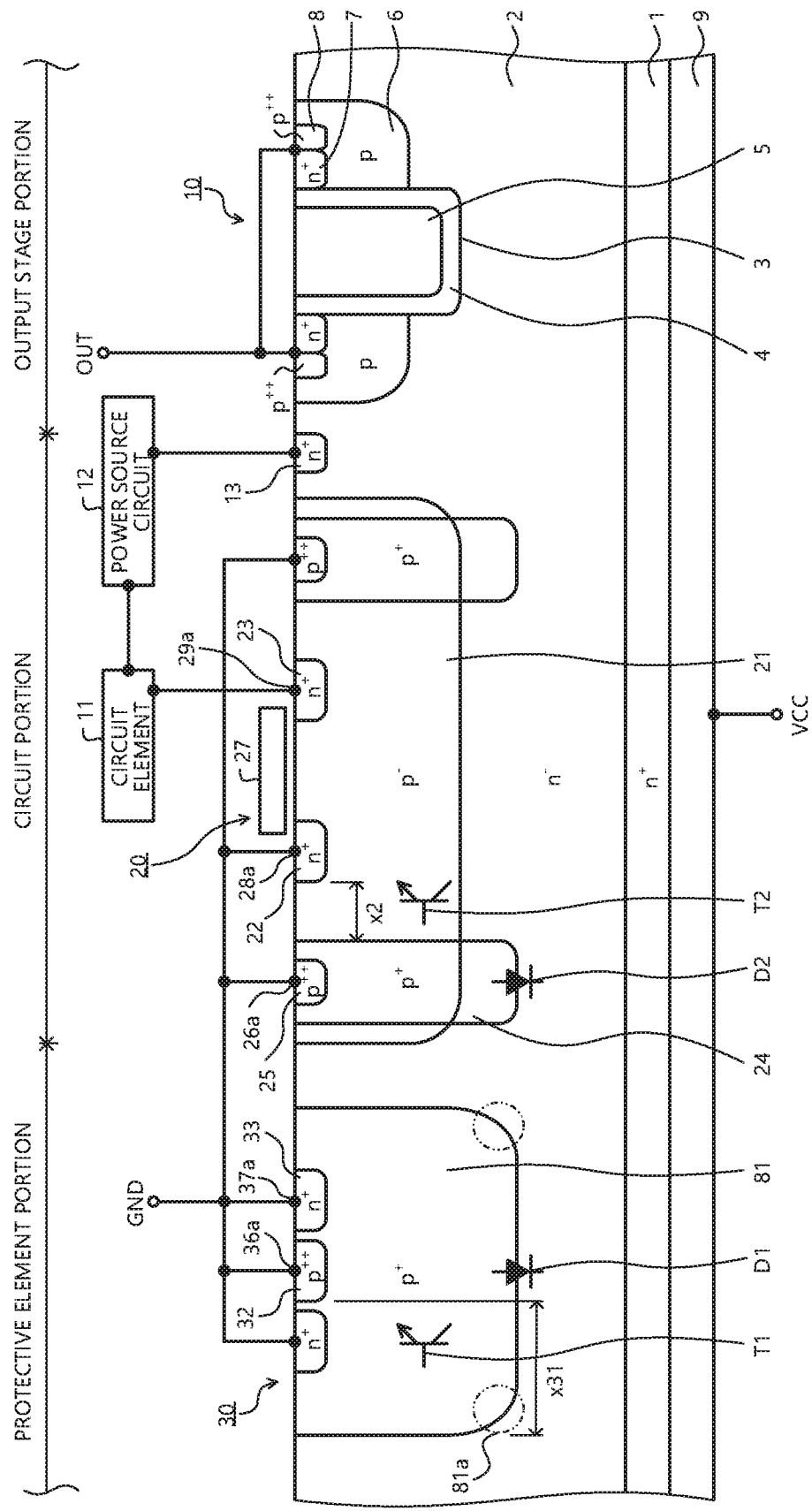
FIG. 11 is a cross-sectional diagram of a structure of a semiconductor device according to a sixth embodiment.
Figure 12:
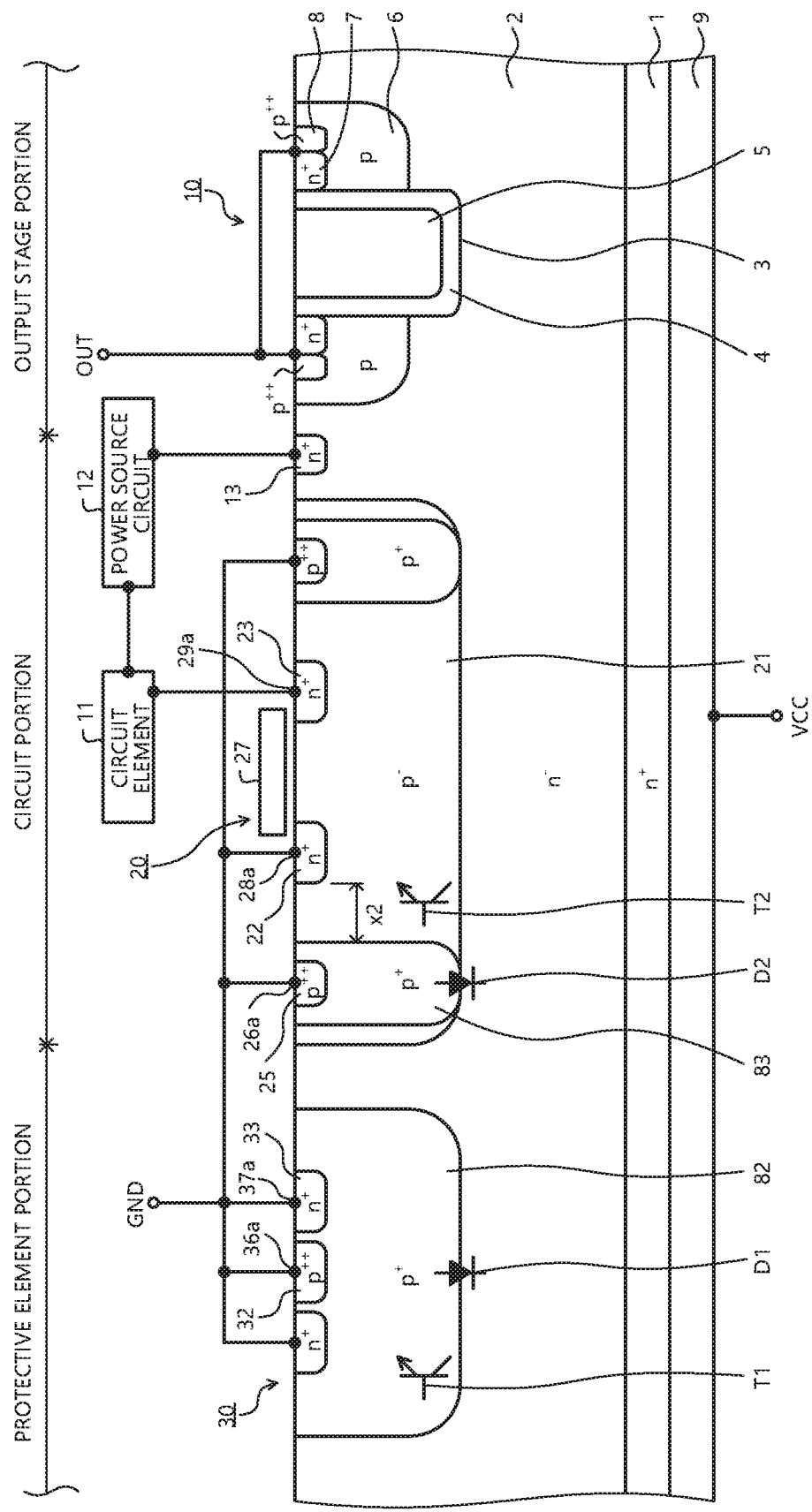
FIG. 12 is a cross-sectional diagram of another example of a structure of the semiconductor device according to the sixth embodiment.

A structure of a semiconductor device according to a sixth embodiment will be described. FIG. 11 is a cross-sectional diagram of a structure of the semiconductor device according to the sixth embodiment. FIG. 12 is a cross-sectional diagram of another example of a structure of the semiconductor device according to the sixth embodiment. The configurations of the circuit portion and the output stage portion of the semiconductor device according to the sixth embodiment are same as those of the semiconductor device according to the first embodiment. The semiconductor device according to the sixth embodiment differs from the semiconductor device according to the first embodiment in that the protective element portion does not have any $p^{+\prime}$-type diffusion region provided therein and the protective element portion includes the $p^{++}$-type contact region (the sixth semiconductor region) 32, the $n^+$-type diffusion region 33, and a $p^+$-type diffusion region (a fourth semiconductor region) 81 constituting the vertical diode D1.

For example, as depicted in FIG. 11, in the protective element portion, the $p^+$-type diffusion region 81 is selectively provided away from the $p^-$-type base region 21 of the circuit portion in the surface layer of the front surface of the base substrate. The $p^{++}$-type contact region 32 and the $n^+$-type diffusion region 33 are each selectively provided inside the $p^+$-type diffusion region 81. The $p^{++}$-type contact region 32 is arranged in a substantially central portion of the $p^+$-type diffusion region 81. For the snapback property of the parasitic bipolar element T2 of the circuit portion, the parasitic bipolar element T1 of the protective element portion merely has to have the predetermined snapback property (see FIG. 4), and the $p^{++}$-type contact region 32 may be omitted depending on the impurity concentration of the $P^+$-type diffusion region 81. In this case, a contact hole 36b of the $p^+$-type diffusion region 81 and constituting a contact portion in contact with the wiring layer is formed in a substantially central portion surrounded by the $n^+$-type diffusion region 33. The $n^+$-type diffusion region 33 is arranged in a substantially rectangular ring planar layout to be away from the $p^{++}$-type contact region 32 and to surround the periphery of the $p^{++}$-type contact region 32. The protective element portion has the parasitic bipolar element T1 formed therein that includes the $n^+$-type diffusion region 33, the $p^+$-type diffusion region 81, and the $n^-$-type epitaxial layer 2.

Preferably, the depths of the $p^{++}$-type contact region 32, the $n^+$-type diffusion region 33, and the $p^+$-type diffusion region 81 are, for example, respectively equal to the depths of the $p^{++}$-type contact region 25, the $n^+$-type source region 22, and the $p^+$-type diffusion region 24 of the circuit portion. The reason for this is that the diffusion regions of the protective element portion can be formed at the same impurity implantation and impurity diffusion step (the impurity implantation and impurity diffusion process) as that for the diffusion regions arranged in the circuit portion, whose conductivity type and the impurity concentration are same as those of the above diffusion regions.

When this configuration is employed, the corner portion (the lower side outer circumferential end) 81a of the $p^+$-type diffusion region 81 is the point of the breakdown of the vertical diode D2. Similar to the first embodiment, the parasitic bipolar element T1 of the protective element portion may therefore be caused to snap back sooner than the parasitic bipolar element T2 of the circuit portion by adjusting a distance x31 from the corner portion 81a of the $p^+$-type diffusion region 81 to the $p^{++}$-type contact region 32 (see FIG. 4). For example, the distance x31 from the corner portion 81a of the $p^+$-type diffusion region 81 to the $p^{++}$-type contact region 32 merely has to be configured to be larger than the distance x2 from the $p^+$-type diffusion region 24 to the $n^+$-type source region 22 of the circuit portion (x31>x2).

Compared to the circuit portion of FIG. 11 and the protective element portion of FIG. 1, the protective element portion of FIG. 11 has no electric field alleviation effect of the $p^-$-type diffusion region and therefore tends to break down. A relation Vbv1<Vbv2 therefore holds between the breakdown voltage Vbv1 of the protective element portion and the breakdown voltage Vbv2 of the circuit portion. The snapback start voltage Vt1 of the protective element portion is more easily adjusted to be a value smaller than the snapback start voltage Vt2 of the circuit portion compared to a case where the adjustment of only the operation resistance is executed. The process step to form the $p^-$-type diffusion region in the protective element portion may be omitted, and the number of process steps may therefore be reduced in a case, for example, where the diffusion regions of the protective element portion and the diffusion regions of the circuit portion are formed using separate process steps and thus, the cost may be suppressed. The adjustment of the snapback start voltage Vt1 may be executed by adjusting the impurity concentration of the $p^+$-type diffusion region 81 in the protective element portion.

As depicted in FIG. 12, the depth of a $p^+$-type diffusion region 82 constituting the vertical diode D1 in the protective element portion and the depth of a $p^+$-type diffusion region 83 constituting the vertical diode D2 in the circuit portion may be set to be equal to the depth of the $p^-$-type base region 21 in the circuit portion.

As described, according to the sixth embodiment, effects identical to those of the first to fifth embodiments may be obtained even when no $p^-$-type diffusion region is provided in the protective element portion.

Figure 14:
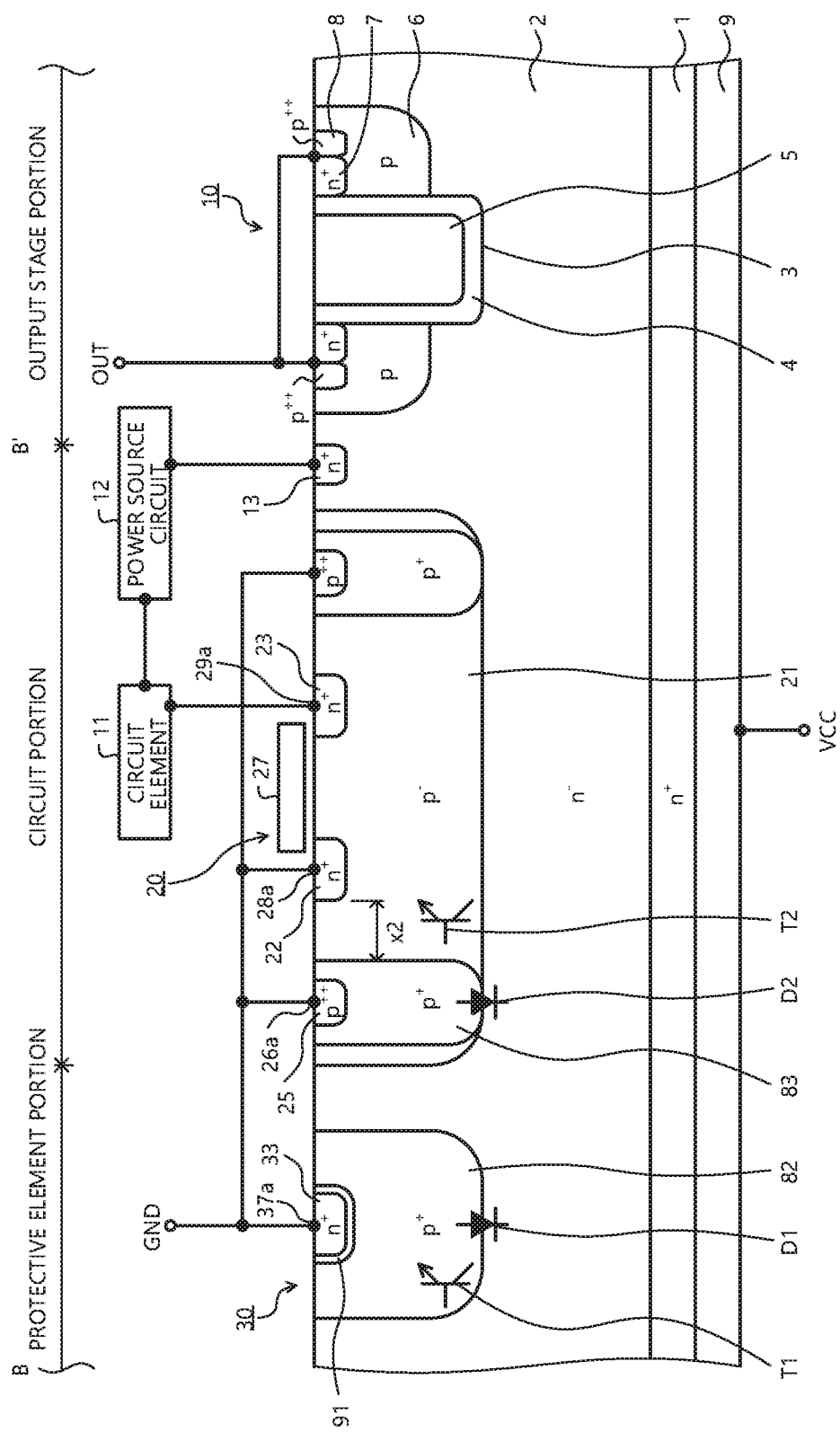
FIG. 14 is a cross-sectional diagram of a structure of a semiconductor device according to a seventh embodiment.
Figure 15:
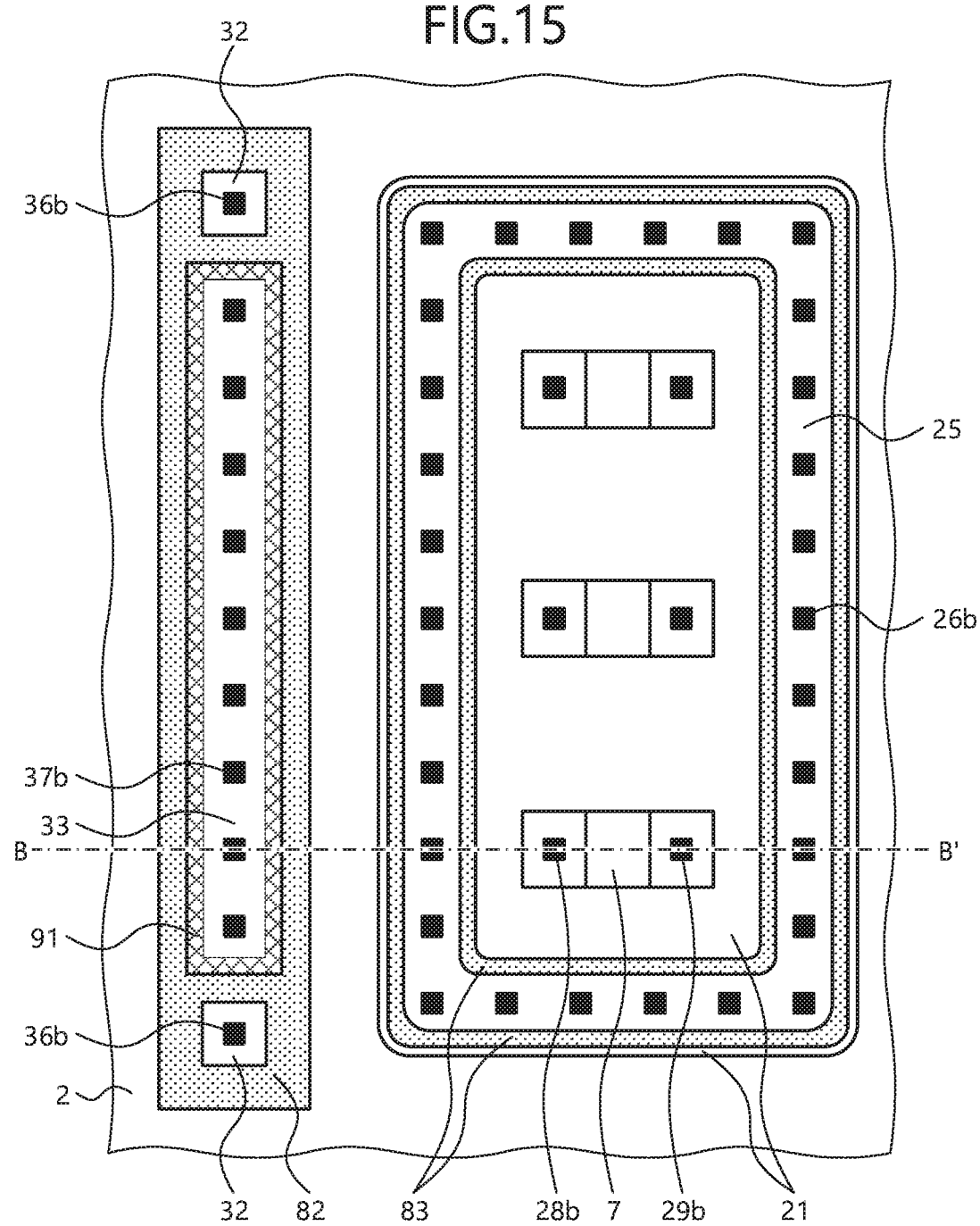
FIG. 15 is a planar diagram of a planar layout of the semiconductor device according to the seventh embodiment.

A structure of a semiconductor device according to a seventh embodiment will be described. FIG. 14 is a cross-sectional diagram of the structure of the semiconductor device according to the seventh embodiment. FIG. 14 depicts the cross-sectional structure taken along a cutting line B-B' in FIG. 15. FIG. 15 is a planar diagram of the planar layout of the semiconductor device according to the seventh embodiment. FIG. 15 depicts a case where plural unit cells of the horizontal n-channel MOSFET 20 of the circuit portion are arranged. The semiconductor device according to the seventh embodiment differs from the semiconductor device according to the sixth embodiment in that an n-type or a p-type diffusion region (a ninth semiconductor region) 91 is provided between the $p^+$-type diffusion region 82 constituting the vertical diode D1 in the protective element portion and the $n^+$-type diffusion region 33 in the $p^+$-type diffusion region 82. The diffusion region 91 has a function of adjusting the snapback start voltage Vt1 of the parasitic bipolar element T1 of the protective element 30.

For example, as depicted in FIG. 14, the diffusion region 91 is provided in the $p^+$-type diffusion region 82 to cover the entire lower portion (the portion on the $n^+$-type supporting substrate 1 side) of the $n^+$-type diffusion region 33. The diffusion region 91 is arranged away from the $p^{++}$-type contact region 32. The diffusion region 91 is an n-type or a p-type diffusion region formed by introducing an n-type impurity or a p-type impurity into the $p^+$-type diffusion region 82 and is formed by, for example, ion implantation and heat treatment for activation. When the diffusion region 91 is formed by introducing a p-type impurity into the $p^+$-type diffusion region 82, the p-type diffusion region 91 is formed having a p-type impurity concentration that is higher than that of the $p^+$-type diffusion region 82. The snapback start voltage Vt1 of the parasitic bipolar element T1 of the protective element 30 becomes higher compared to a case where the diffusion region 91 is not provided, as the p-type impurity concentration of the p-type diffusion region 91 becomes higher.

On the other hand, when the diffusion region 91 is formed by introducing an n-type impurity into the $p^+$-type diffusion region 82, the diffusion region 91 is formed having an n-type impurity concentration that is higher than that of the $p^+$-type diffusion region 82. In this case, the conductivity type of the diffusion region 91 is determined by the dose amount of the n-type impurity introduced into the $p^+$-type diffusion region 82. When the n-type impurity concentration of the diffusion region 91 is lower than the p-type impurity concentration of the $p^+$-type diffusion region 82, a p-type diffusion region 91 is formed having an impurity concentration that is lower than that of the $p^+$-type diffusion region 82. When the n-type impurity concentration of the diffusion region 91 is higher than the p-type impurity concentration of the $p^+$-type diffusion region 82, a portion of the $p^+$-type diffusion region 82 inverts to have the n-type and an n-type diffusion region 91 is formed. The snapback start voltage Vt1 of the parasitic bipolar element T1 of the protective element 30 becomes lower compared to a case where the diffusion region 91 is not provided, as the n-type impurity concentration of the n-type diffusion region 91 becomes higher.

As depicted in FIG. 15, the $n^+$-type diffusion region 33 may be arranged in, for example, a substantially straight line planar layout. The $p^+$-type contact region 32 may be arranged along, for example, a straight line that passes through the n⁺-type diffusion region 33 in parallel to the longitudinal direction of the n⁺-type diffusion region 33 (a direction to extend in the straight line). The diffusion region 91 is arranged in, for example, a substantially straight line planar layout that covers the periphery of the n⁺-type diffusion region 33. The plural contact holes 37b each constituting the contact portion 37a (see FIG. 14) between the n⁺-type diffusion region 33 and the wiring layer (not depicted) each have, for example, a substantially rectangular planar shape and are provided to be scattered along the longitudinal direction of the n⁺-type diffusion region 33. The contact hole 36b constituting the contact portion between the p⁺⁺-type contact region 32 and the wiring layer has, for example, a substantially rectangular planar shape and one contact hole 36b is provided. The configurations of the circuit portion and the output stage portion are same as those of the sixth embodiment.

Figure 16:
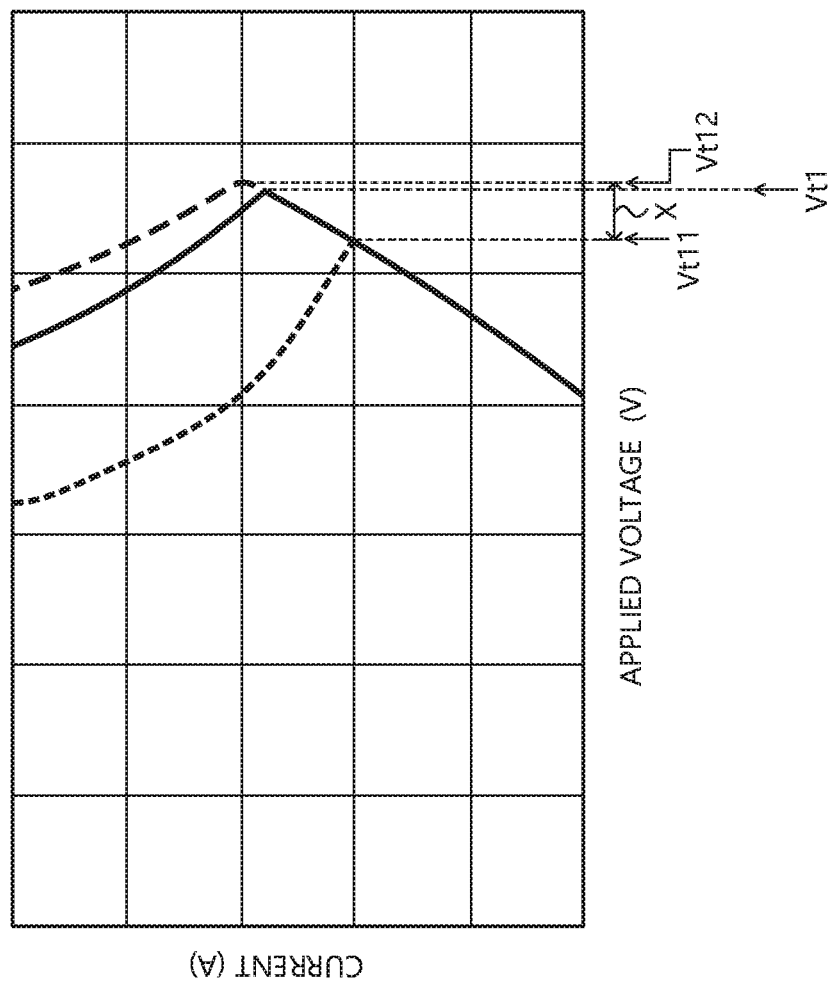
FIG. 16 is a characteristics diagram of the snapback property of the semiconductor device according to the seventh embodiment.

An operation of the protective element portion will be described. FIG. 16 is a characteristics diagram of the snapback property of the semiconductor device according to the seventh embodiment. FIG. 16 depicts the current-voltage (I-V) waveforms of Examples 1 and 2, and Comparative Example taken when the voltage of the VCC terminal is increased due to the intrusion of the surge voltage from the VCC terminal. Comparative Example 1 is the protective element 30 that has the n-type diffusion region 91 provided therein according to the configuration of the semiconductor device according to the seventh embodiment. Example 2 is the protective element 30 that has the p-type diffusion region 91 provided therein according to the configuration of the semiconductor device according to the seventh embodiment. Comparative Example has the same configuration as those of Examples 1 and 2 except that the diffusion region 91 is not provided therein, and corresponds to, for example, the protective element 30 of the sixth embodiment.

As depicted in FIG. 16, a snapback start voltage Vt11 of the parasitic bipolar element T1 of Example 1 is lower than the snapback start voltage Vt1 of the parasitic bipolar element T1 of Comparative Example. A snapback start voltage Vt12 of the parasitic bipolar element T1 of Example 2 is higher than the snapback start voltage Vt1 of the parasitic bipolar element T1 of Comparative Example. The snapback start voltage Vt1 of the parasitic bipolar element T1 of the protective element 30 may therefore be adjusted by adjusting the n-type impurity concentration or the p-type impurity concentration of the diffusion region 91. The adjustable range thereof is a range X that is equal to or higher than the snapback start voltage Vt11 of the parasitic bipolar element T1 of Example 1 and equal to or lower than the snapback start voltage Vt12 of the parasitic bipolar element T1 of Example 2.

The p⁺-type diffusion region 83 may be arranged to overlap a portion of the n⁺-type source region 22 of the horizontal n-channel MOSFET 20 by increasing the width of the p⁺-type diffusion region 83 constituting the vertical diode D2 in the circuit portion by applying the second embodiment to the seventh embodiment. Similar to the second embodiment, the parasitic operation of the horizontal n-channel MOSFET 20 is thereby suppressed and the snapback start voltage Vt2 of the parasitic bipolar element T2 of the circuit portion becomes high. Thus, the difference between the snapback start voltage Vt1 of the parasitic bipolar element T1 of the protective element 30 and the snapback start voltage Vt2 of the parasitic bipolar element T2 of the circuit portion becomes great, and the margin of the parasitic operation may therefore be ensured.

As described, according to the seventh embodiment, effects identical to those of the first to the sixth embodiments may be obtained. According to the seventh embodiment, the snapback start voltage of the parasitic bipolar element of the protective element may be adjusted by providing the n-type or the p-type diffusion region to cover the entire lower portion of the n⁺-type diffusion region in the p⁺-type diffusion region constituting the vertical diode in the protective element portion. The width of the p-type diffusion region thereby does not need to be secured to adjust the parasitic resistance of the protective element portion as described in Japanese Laid-Open Patent Publication No. 2010-182727 and a trigger element does not need to be added on the same substrate as described in Japanese Laid-Open Patent Publication No. 2010-157642, to adjust the snapback start voltage of the parasitic bipolar element of the protective element. The footprint of the protective element may thereby be reduced, the protective element is therefore easily arranged at a position close to the point at which the snapping back tends to occur, and the degree of freedom of the circuit design becomes high. The degree of freedom of the circuit design also becomes high when the protective elements are arranged at plural points.

Figure 17:
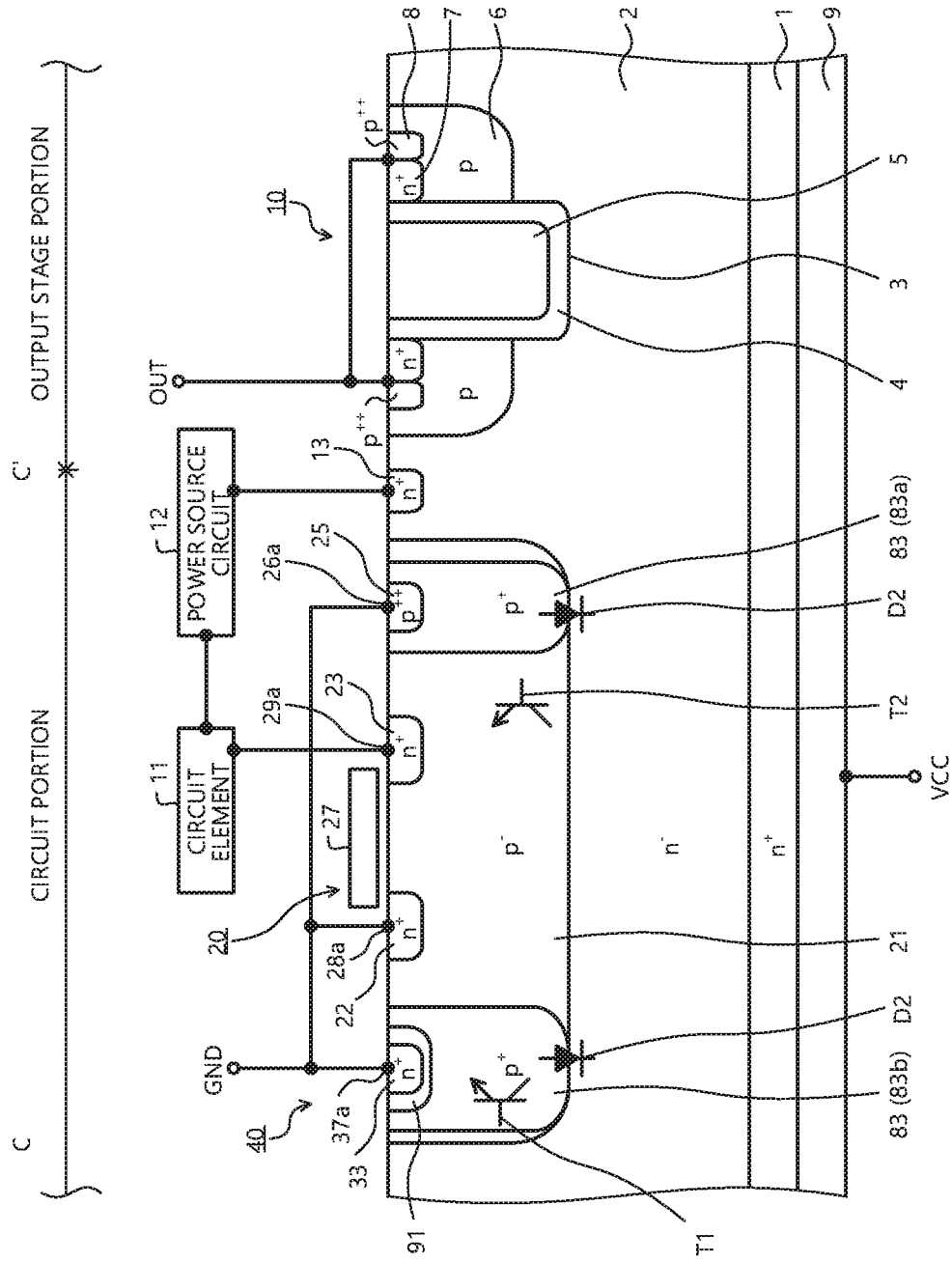
FIG. 17 is a cross-sectional diagram of a structure of a semiconductor device according to an eighth embodiment.
Figure 18:
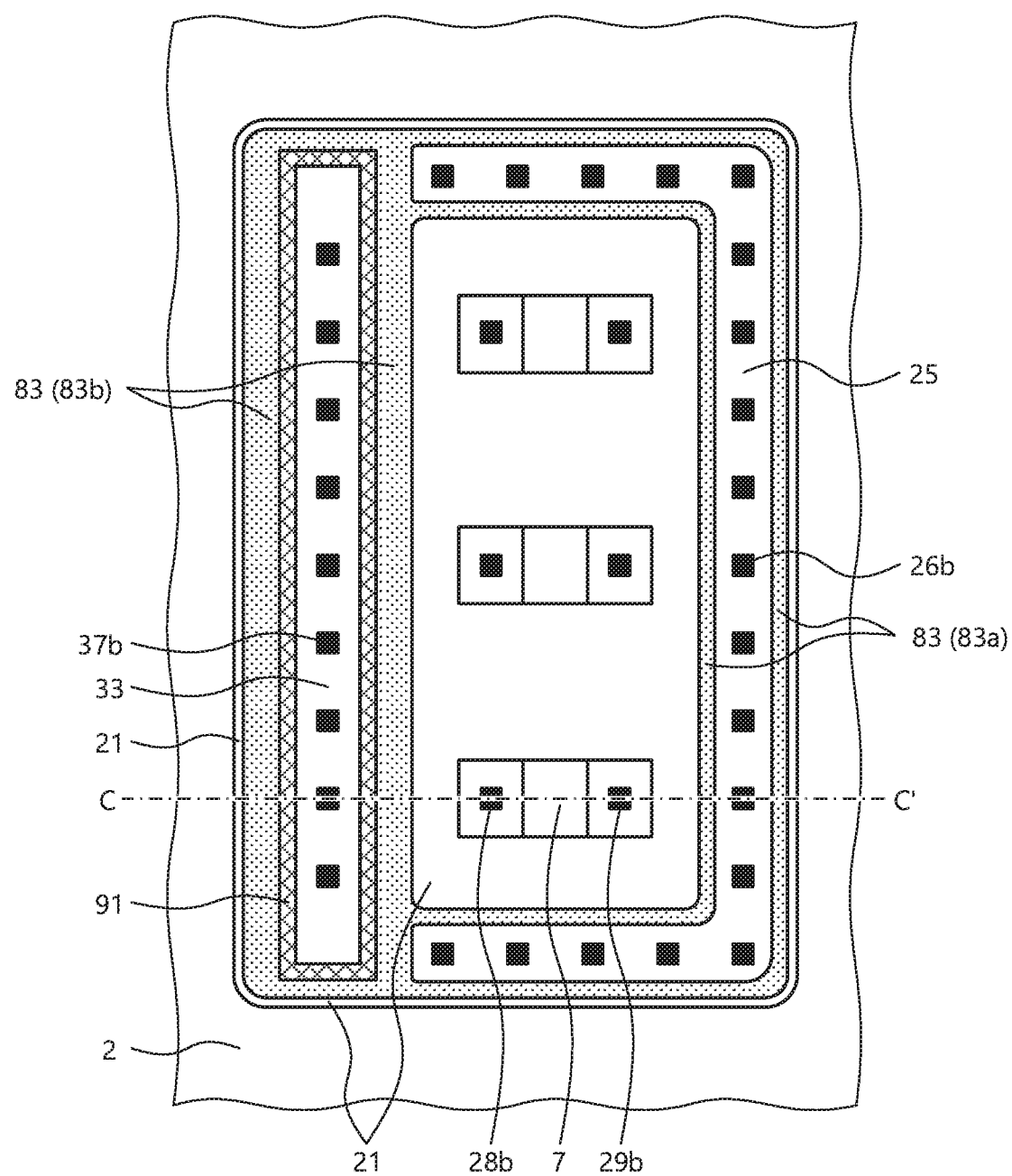
FIG. 18 is a planar diagram of a planar layout of the semiconductor device according to the eighth embodiment.

A structure of a semiconductor device according to an eighth embodiment will be described. FIG. 17 is a cross-sectional diagram of the structure of the semiconductor device according to the eighth embodiment. FIG. 17 depicts the cross-sectional structure taken along a cutting line C-C' in FIG. 18. FIG. 18 is a planar diagram of the planar layout of the semiconductor device according to the eighth embodiment. The semiconductor device according to the eighth embodiment differs from the semiconductor device according to the seventh embodiment in that a protective element 40 including the n-type or p-type diffusion region 91 is integrated with the p⁺-type diffusion region 83 that functions as a guard ring in the circuit portion. The protective element 40 is arranged in the circuit portion by configuring the protective element 40 using the vertical diode D2 that is formed in the circuit portion.

For example, as depicted in FIGS. 17 and 18, the n⁺-type diffusion region 33 is arranged in a substantially straight line planar layout along one side of the p⁺-type diffusion region 83 that is arranged in a substantially rectangular frame planar layout surrounding the periphery of the horizontal n-channel MOSFET 20. In this case, the p⁺⁺-type contact region 25 present inside the p⁺-type diffusion region 83 is arranged in, for example, a substantially C-shaped planar layout along the other three sides of the p⁺-type diffusion region 83. In the p⁺-type diffusion region 83, a portion 83b where the n⁺-type diffusion region 33 is arranged thereby acts as the protective element 40, and a portion 83a where the p⁺⁺-type contact region 25 is arranged functions as a guard ring.

In the p⁺-type diffusion region 83 (83b) and away from the p⁺⁺-type contact region 25, the diffusion region 91 is arranged in, for example, a substantially linear planar layout to cover the periphery of the n⁺-type diffusion region 33. The configuration is same as that of the seventh embodiment except for the arrangement of the diffusion region 91. Here, although the protective element 40 is integrated with the side of the p⁺-type diffusion region 83 facing the n⁺-type source region 22 of the horizontal n-channel MOSFET 20, the protective element 40 may be integrated with the other side of the p⁺-type diffusion region 83. Although not depicted, the eighth embodiment is applied to the seventh embodiment, and the protective element 40 arranged in the circuit portion and the protective element of the protective element portion arranged outside the circuit portion (the reference numeral "30" of FIG. 14) may concurrently be used.

Even when the protective element 40 including the vertical diode D2 is integrated with the guard ring as above, the same effect as that of the seventh embodiment is achieved by providing the n-type or p-type diffusion region 91 to cover the entire lower portion of the n$^+$-type diffusion region 33. When the parasitic bipolar element T1 of the protective element 40 and including the n$^+$-type diffusion region 33, the p$^+$-type diffusion region 83, and the n$^-$-type epitaxial layer 2 snaps back, avalanche current flows through the n$^+$-type source region 22 of the horizontal n-channel MOSFET 20 and the n$^+$-type diffusion region 33 in the p$^+$-type diffusion region 83. Compared to a case where the vertical diode D2 that parasitizes the guard ring to operate is not provided, since the avalanche current is distributed among the n$^+$-type source region 22 of the horizontal n-channel MOSFET 20 and the p$^+$-type diffusion region 83, a higher current may flow.

As described, according to the eighth embodiment, effects identical to those of the first to the seventh embodiments may be obtained even when the protective element is integrated with the p$^+$-type diffusion region that functions as the guard ring in the circuit portion. According to the eighth embodiment, size reductions may be facilitated by integrating the protective element with the p$^+$-type diffusion region that functions as the guard ring in the circuit portion.

Figure 19:
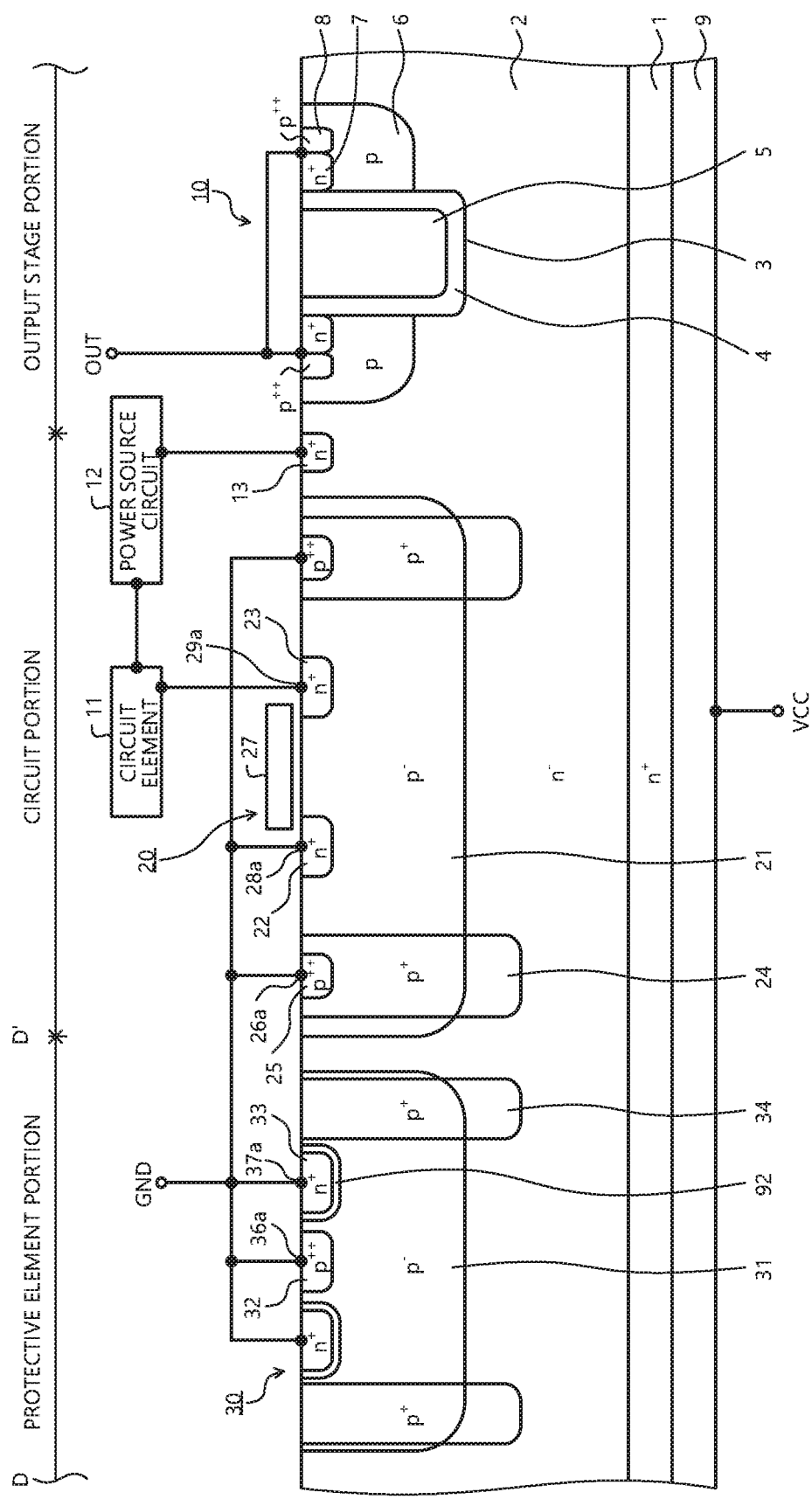
FIG. 19 is a cross-sectional diagram of the structure of the semiconductor device according to a ninth embodiment.
Figure 20:
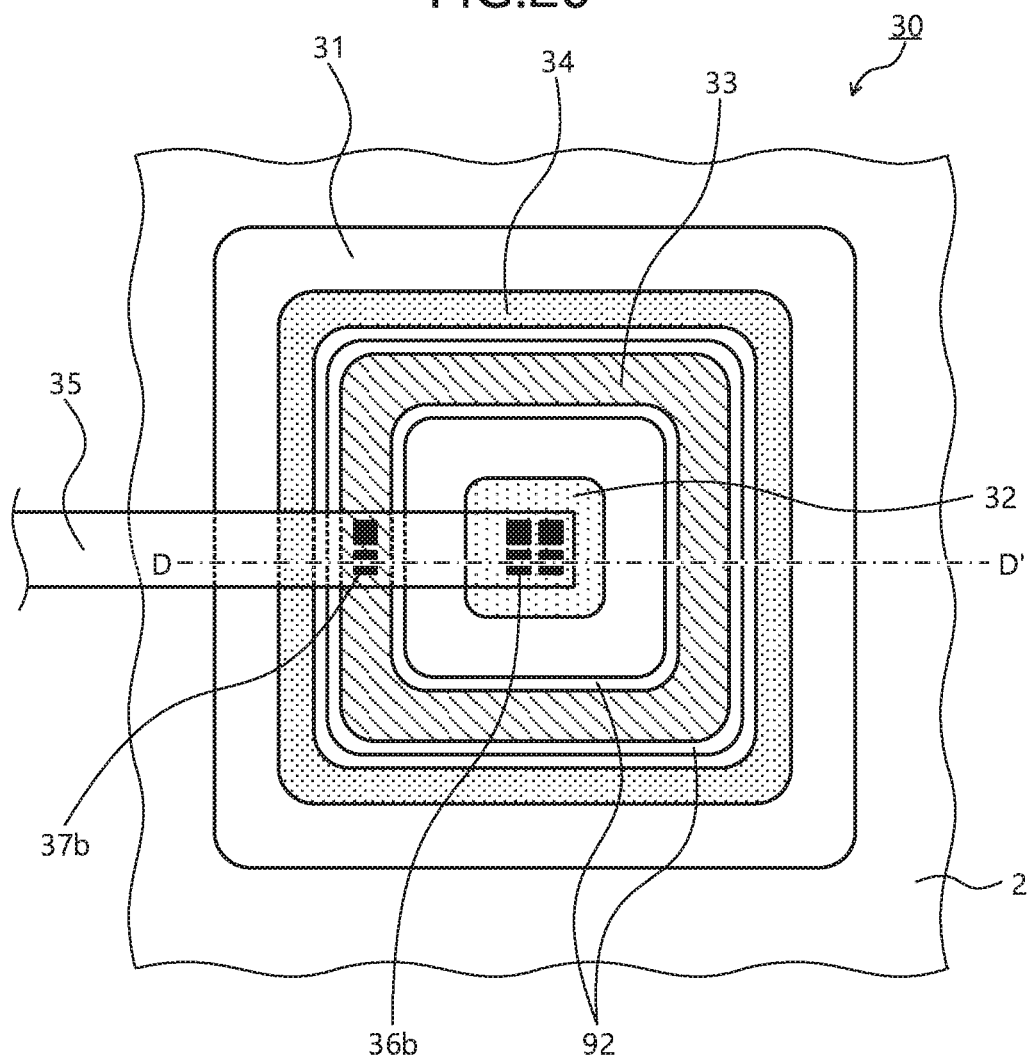
FIG. 20 is a planar diagram of the planar layout of the semiconductor device according to the ninth embodiment.
Figure 21:
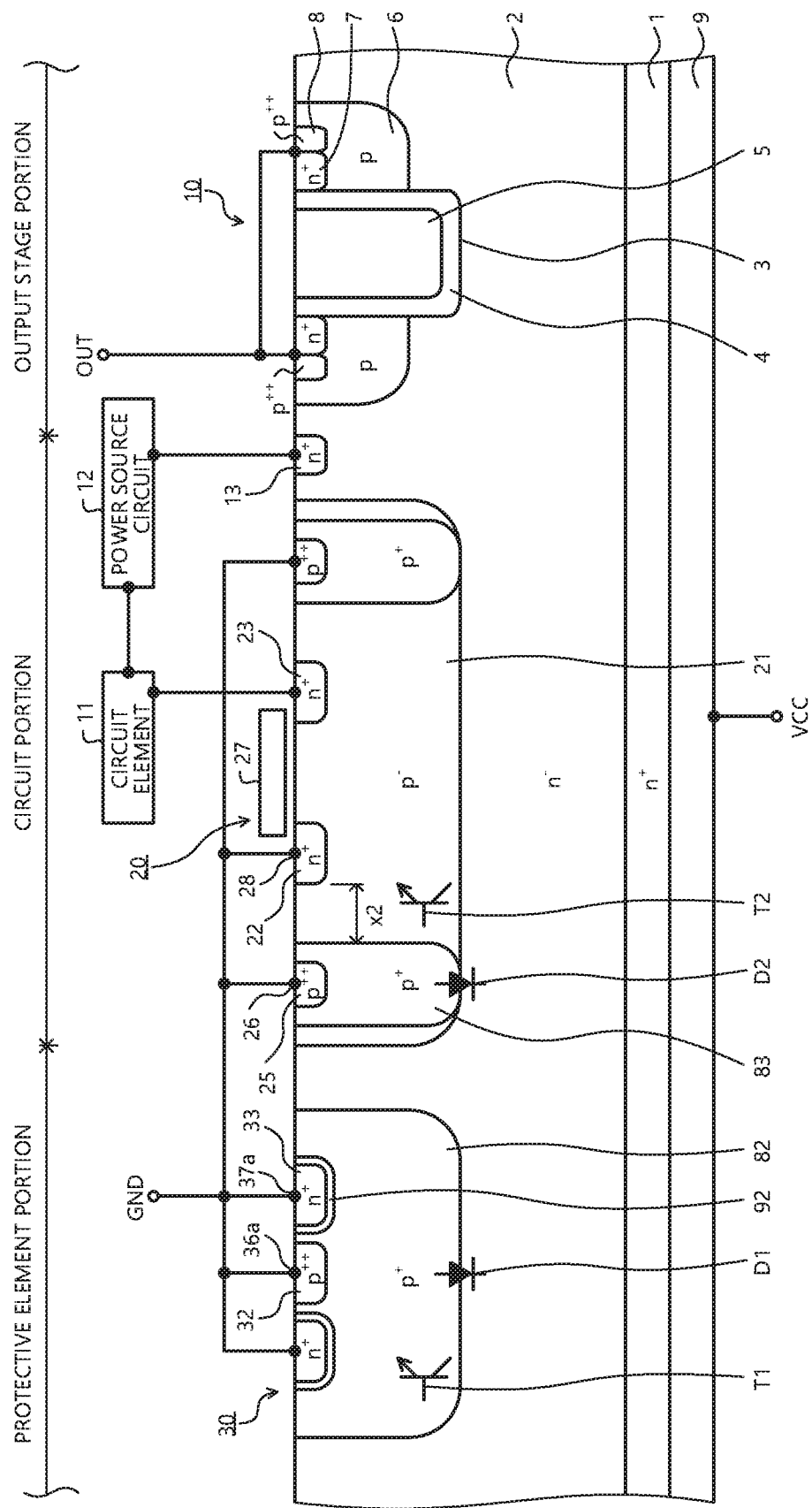
FIG. 21 is a cross-sectional diagram of another example of the structure of the semiconductor device according to the ninth embodiment.

A structure of a semiconductor device according to a ninth embodiment will be described. FIG. 19 is a cross-sectional diagram of the structure of the semiconductor device according to the ninth embodiment. FIG. 19 depicts the cross-sectional structure taken along a cutting line D-D' in FIG. 20. FIG. 20 is a planar diagram of the planar layout of the semiconductor device according to the ninth embodiment. FIG. 21 is a cross-sectional diagram of another example of the structure of the semiconductor device according to the ninth embodiment. The semiconductor devices according to the ninth embodiment depicted in FIGS. 20 and 21 are semiconductor devices that are formed by applying the seventh embodiment respectively to the first and the sixth embodiments.

For example, an n-type or p-type diffusion region 92 is arranged in a substantially rectangular ring planar layout along the n$^+$-type diffusion region 33 that is arranged in a substantially rectangular ring planar layout surrounding the periphery of the p$^{++}$-type contact region 32 of the protective element portion. Similar to the seventh embodiment, the diffusion region 92 is provided to cover the entire lower portion of the n$^+$-type diffusion region 33. Similar to the seventh embodiment, the snapback start voltage Vt1 of the parasitic bipolar element T1 of the protective element 30 may be adjusted by adjusting the n-type impurity concentration and the p-type impurity concentration of the diffusion region 92.

As described, according to the ninth embodiment, effects identical to those of the first, sixth, and seventh embodiments may be obtained.

Figure 22:
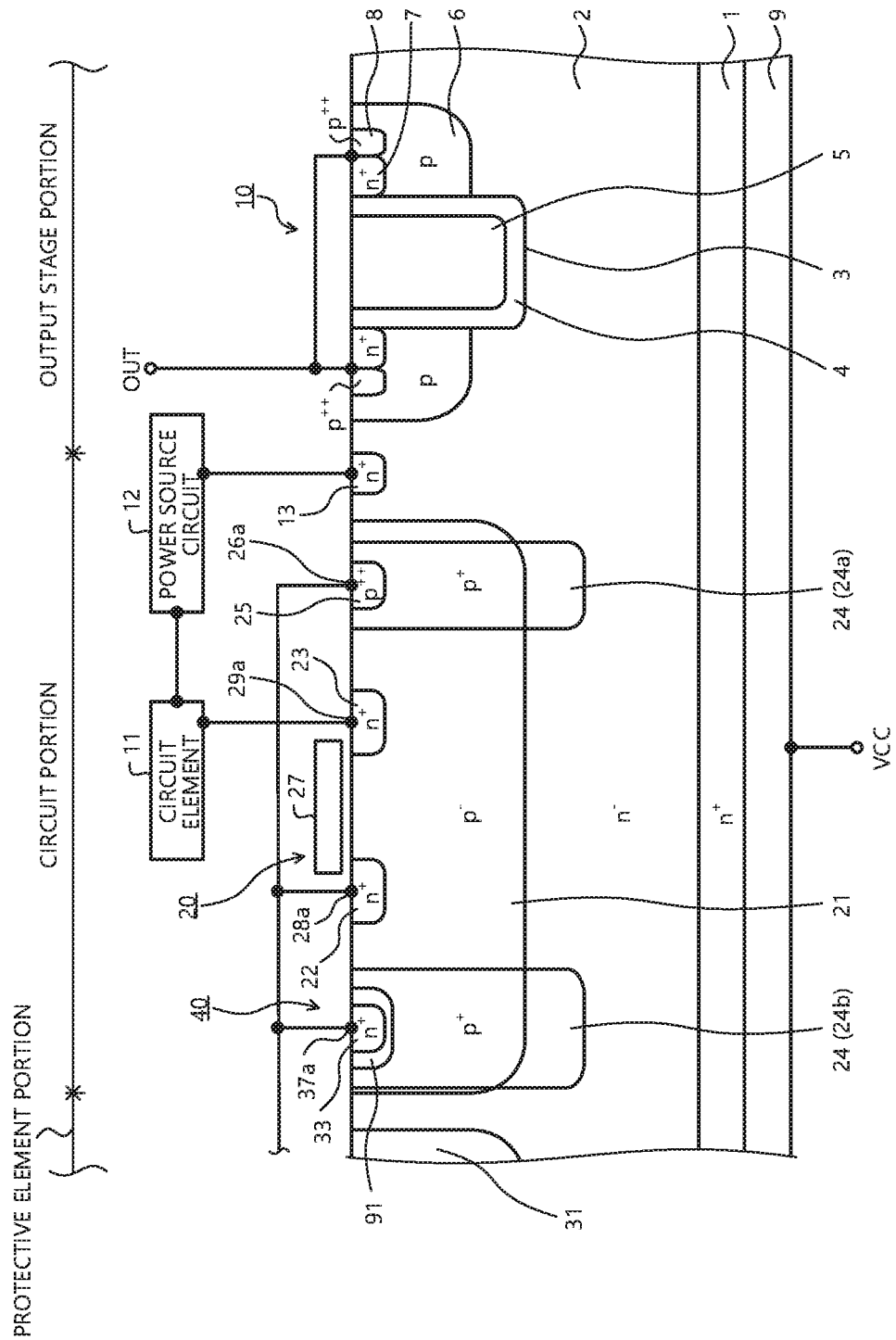
FIG. 22 is a cross-sectional diagram of a structure of a semiconductor device according to a tenth embodiment.
Figure 23:
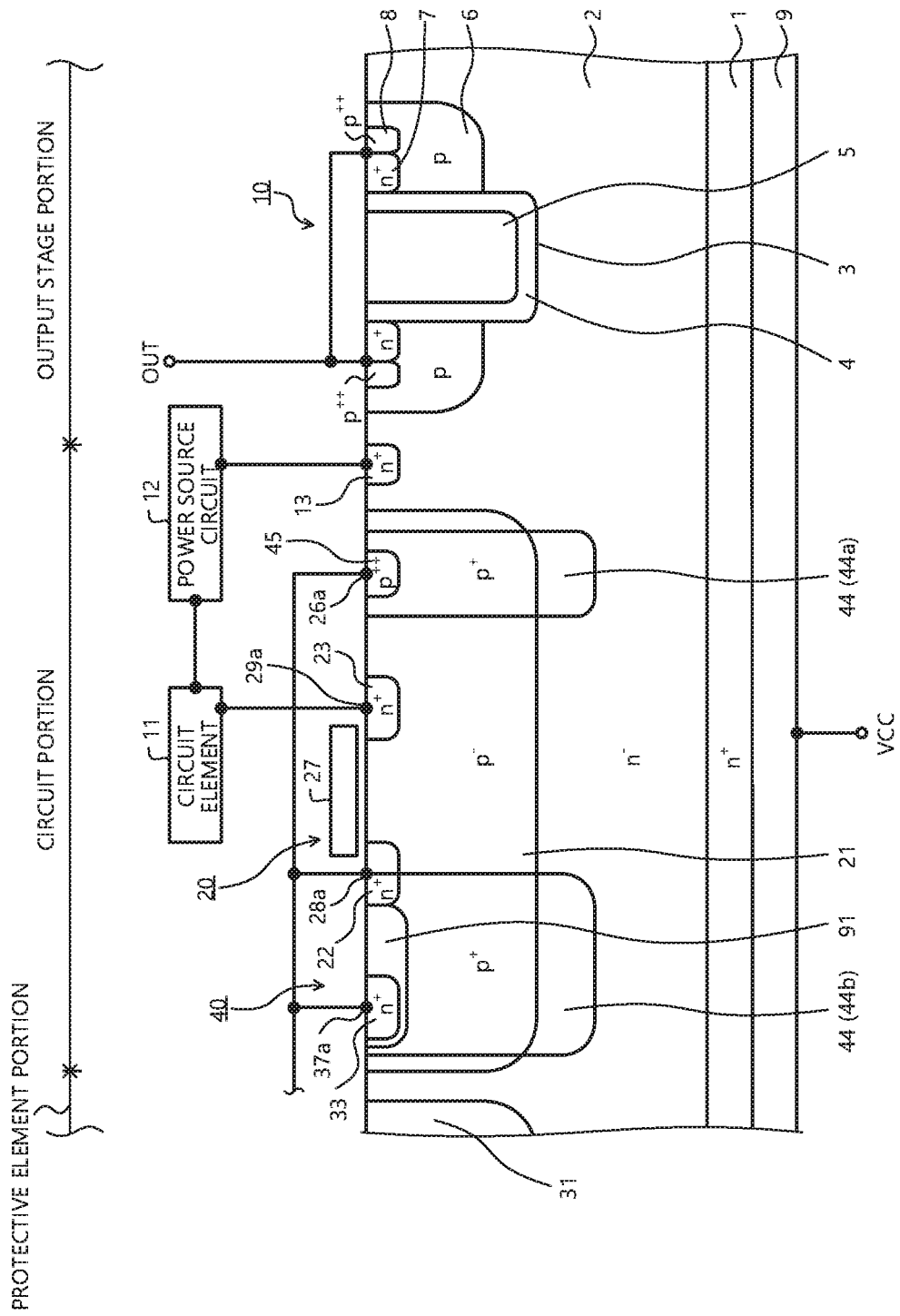
FIG. 23 is a cross-sectional diagram of another example of a structure of the semiconductor device according to the tenth embodiment.

A structure of a semiconductor device according to a tenth embodiment will be described. FIG. 22 is a cross-sectional diagram of a structure of the semiconductor device according to the tenth embodiment. FIG. 23 is a cross-sectional diagram of another example of a structure of the semiconductor device according to the tenth embodiment. The semiconductor devices according to the tenth embodiment depicted in FIGS. 22 and 23 are semiconductor devices respectively formed by applying the eighth embodiment to the first and the second embodiments.

For example, as depicted in FIG. 22, the protective element 40 including the n-type or p-type diffusion region 91 similar to that of the eighth embodiment is integrated with a portion 24b of the p$^+$-type diffusion region 24 that functions as a guard ring in the circuit portion. The protective element 40 including the diffusion region 91 is thereby arranged in the circuit portion in addition to the protective element (not depicted) of the protective element portion arranged outside the circuit portion, and these two protective elements are used concurrently. As depicted in FIG. 23, in the p$^+$-type diffusion region 44 functioning as the guard ring in the circuit portion, the width of a portion 44b integrated with the protective element 40 may be increased to overlap a portion of the n$^+$-type source region 22 of the horizontal n-channel MOSFET 20.

Here, although the protective element 40 is integrated with the portions 24b and 44b of the p$^+$-type diffusion region 24 facing the n$^+$-type source region 22 of the horizontal n-channel MOSFET 20, the protective element 40 may be integrated with other portions 24a and 44a of the p$^+$-type diffusion region 24. FIGS. 22 and 23 do not depict the components constituting the protective element portion arranged outside the circuit portion, however, the configuration of the protective element portion may be same as that of the first and second embodiments or may be same as that of the ninth embodiment. When the configuration of the protective element portion arranged outside the circuit portion is set to be same as that of the ninth embodiment, the n-type or p-type diffusion region 91 is arranged in the protective element of the protective element portion.

As described, according to the tenth embodiment, effects identical to those of the first, eighth, and ninth embodiment may be obtained.

In the first embodiment and the like, the impurity concentration and the depth of the p$^-$-type diffusion region 31 need to be adjusted to adjust the snapback start current of the vertical snap diode like the protective element 30. On the other hand, as described, to reduce the manufacturing cost, it is preferable to concurrently form the p$^-$-type diffusion region 31 constituting the protective element 30 of the protective element portion and the p$^-$-type diffusion region 21 constituting the horizontal n-channel MOSFET 20 of the circuit portion. In this case, when the impurity concentrations and the depths of the p$^-$-type diffusion region 21 and the p$^-$-type diffusion region 31 are determined prioritizing the property of the horizontal n-channel MOSFET 20, the adjustment of the snapback start current of the protective element 30 may be difficult. A semiconductor device will be described for which effective protection may be obtained even when the adjustment of the snapback start current of the protective element 30 is difficult.

Figure 24:
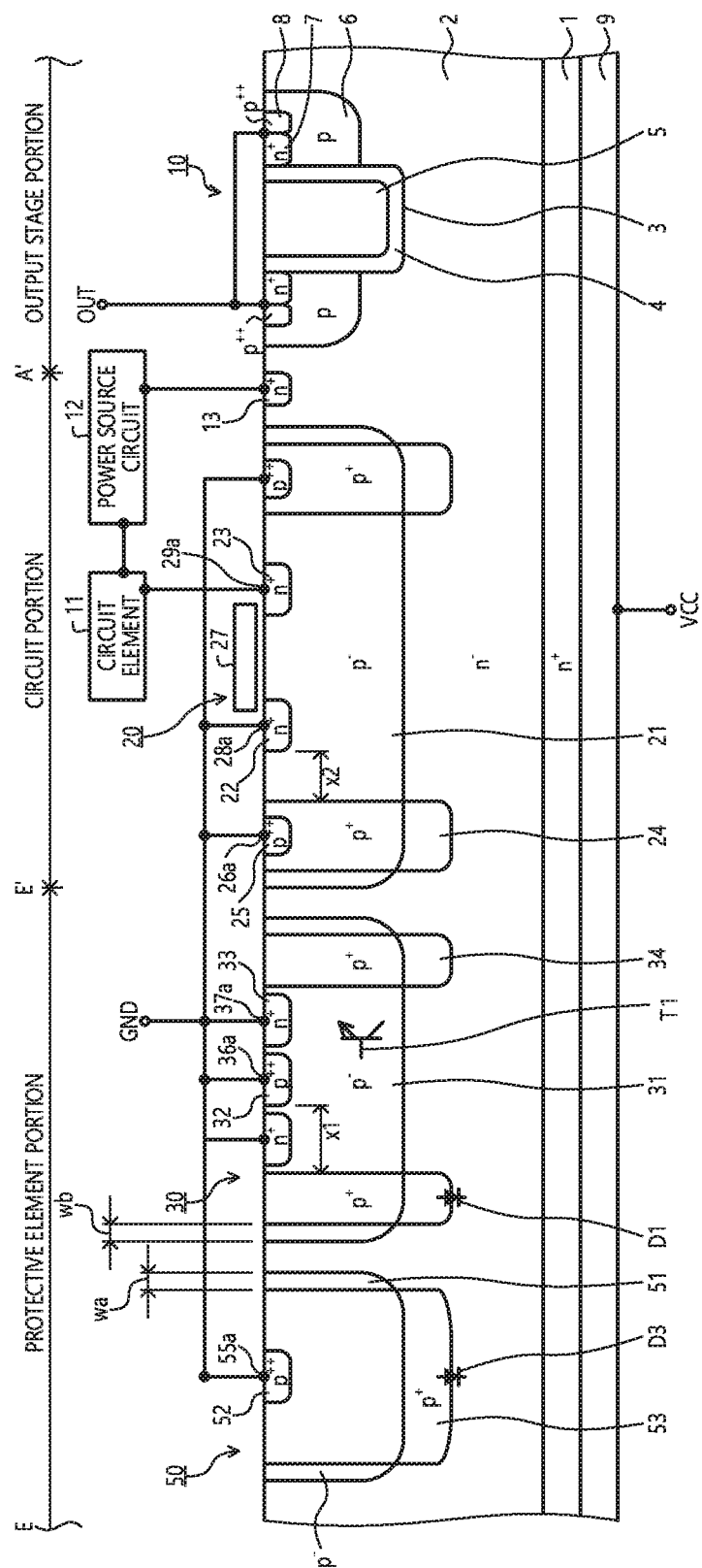
FIG. 24 is a cross-sectional diagram of a structure of a semiconductor device according to an eleventh embodiment.
Figure 25:
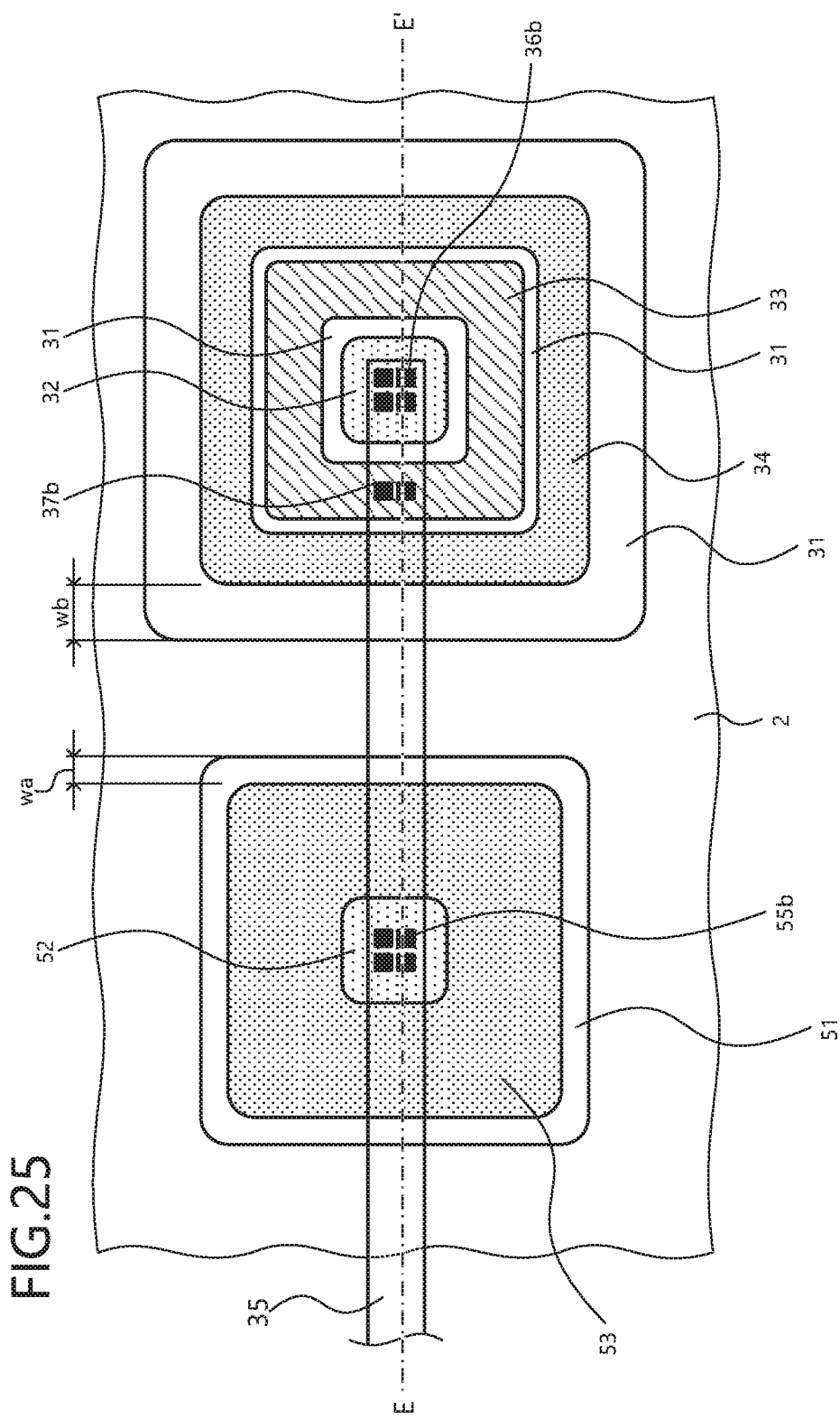
FIG. 25 is a planar diagram of a planar layout of the semiconductor device according to the eleventh embodiment.

A structure of a semiconductor device according to an eleventh embodiment will be described. FIG. 24 is a cross-sectional diagram of the structure of the semiconductor device according to the eleventh embodiment. FIG. 24 depicts the cross-sectional structure taken along a cutting line E-E' in FIG. 25. FIG. 25 is a planar diagram of the planar layout of the semiconductor device according to the eleventh embodiment. FIG. 25 depicts only the protective element portion. The semiconductor device according to the eleventh embodiment differs from the semiconductor device according to the first embodiment in that the protective element portion further includes a protective element (a second protective element) 50 to be away from the protective element (a first protective element) 30.

The protective element 50 includes a p$^-$-type diffusion region (a tenth semiconductor region) 51 selectively provided in the surface layer of the n⁻-type epitaxial layer 2. The p⁻-type diffusion region 51 is arranged away from the p-type base region 6 of the vertical MOSFET 10 of the output stage portion, the p⁻-type diffusion region 21 of the circuit portion, and the p⁻-type diffusion region 31 of the protective element 30. A p⁺⁺-type contact region (a twelfth semiconductor region) 52 and a p⁺-type diffusion region (an eleventh semiconductor region) 53 are selectively provided inside the p⁻-type diffusion region 51.

The p⁺⁺-type contact region 52 is connected to the GND terminal through the wiring layer 35. One or more contact hole(s) 55b for the p⁺⁺-type contact region 52 to constitute a contact portion 55a in contact with the wiring layer 35 is/are arranged (FIG. 25). FIG. 25 depicts a state where the contact hole 55b is arranged in plural (black rectangular portions). The depth of the p⁺-type diffusion region 53 may be deeper than the depth of the p⁻-type diffusion region 51. A vertical diode D3 is formed by a pn-junction between the p⁺-type diffusion region 53 and the n⁻-type epitaxial layer 2.

The avalanche voltage (the breakdown voltage) of the vertical diode D3 of the protective element 50 is lower than the avalanche voltage of the vertical diode D1 by the pn-junction between the p⁺-type diffusion region 34 of the protective element 30 and the n⁻-type epitaxial layer 2. For example, an overhang width wa in the lateral direction from the p⁺-type diffusion region 53 of the p⁻-type diffusion region 51 of the protective element 50 is set to be smaller than an overhang width wb in the lateral direction from the p⁺-type diffusion region 34 of the p⁻-type diffusion region 31 of the protective element 30. The electric field alleviation effect of the outer periphery portion of the protective element 50 is weakened by setting the overhang width wa of the p⁻-type diffusion region 51 of the protective element 50 to be smaller than the overhang width wb of the p⁻-type diffusion region 31 of the protective element 30. The avalanche voltage of the vertical diode D3 can thereby be set to be lower than the avalanche voltage of the vertical diode D1.

In this embodiment, the protective element 30 is desirably set such that the parasitic bipolar element T1 immediately operates when the breakdown voltage is exceeded. For example, the distance x1 from the p⁺-type diffusion region 34 to the p⁺⁺-type contact region 32 is set to be sufficiently long. In this protective element 30, the snapping back occurs due to the operation of the parasitic bipolar element T1 and the snapback start current therefore does not need to be adjusted by adjusting the impurity concentration and the depth of the p⁻-type diffusion region 31.

In this embodiment, the impurity concentration and the depth of the p⁻-type diffusion region 21 may be configured giving priority to the characteristics of the elements to be formed in the circuit portion even when the diffusion regions of the p⁻-type diffusion region 31 and the p⁻-type diffusion region 51 of the protective element portion, and the p⁻-type diffusion region 21 of the circuit portion are concurrently formed at the same impurity implantation and impurity diffusion step.

Figure 26:
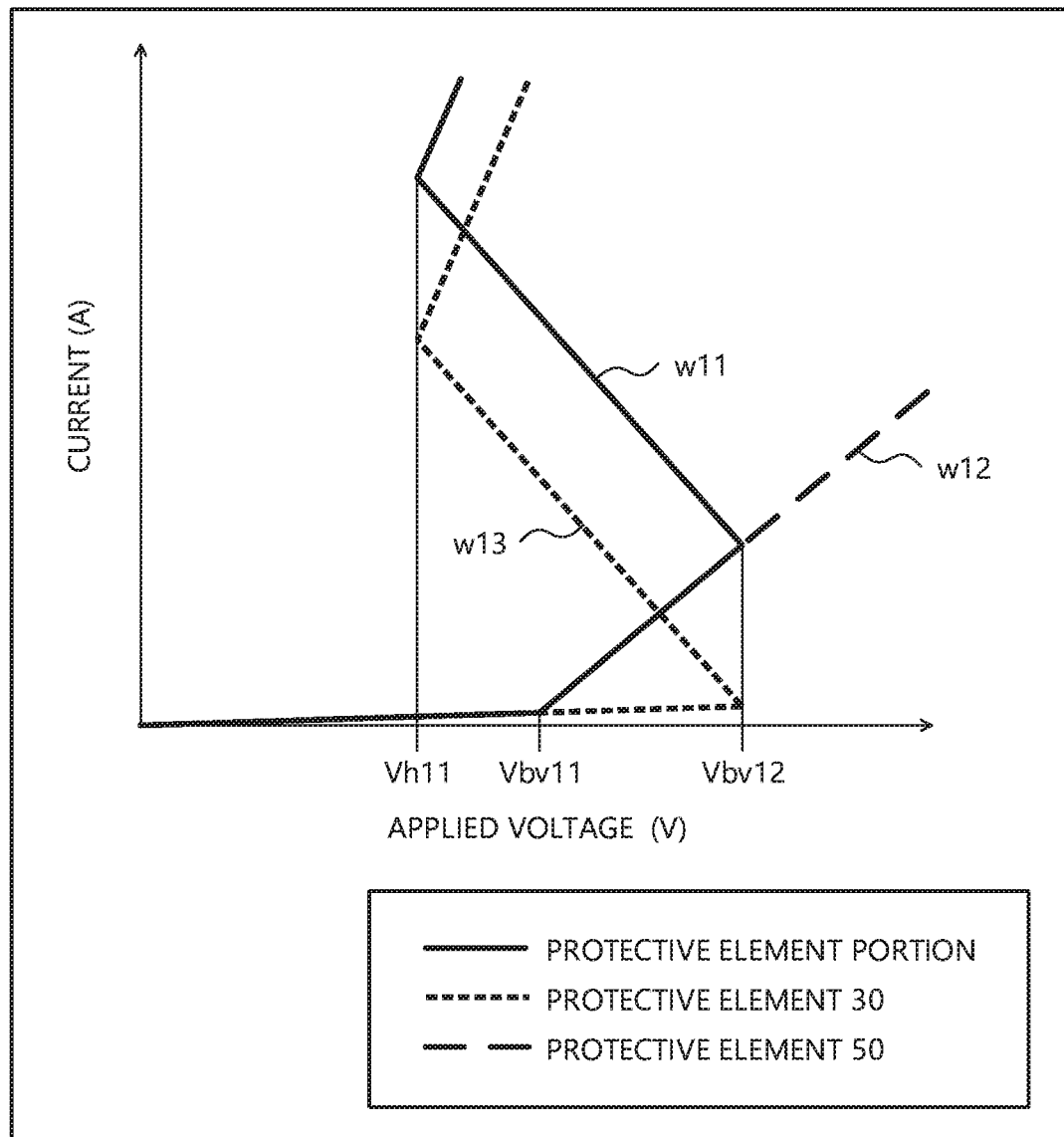
FIG. 26 is a characteristics diagram of the snapback property of the semiconductor device according to the eleventh embodiment.

FIG. 26 is a characteristics diagram of the snapback property of the semiconductor device according to the eleventh embodiment. An operation executed in a case where the protective element 50 is present alone will be described with reference to a current-voltage (I-V) waveform w12. When a surge voltage intrudes from the VCC terminal, the voltage of the VCC terminal is thereby increased, and the applied voltage reaches a breakdown voltage Vbv11, the vertical diode D3 runs into a breakdown at a pn-junction between the p⁺-type diffusion region 53 and the n⁻-type epitaxial layer 2, and a current (an avalanche current) starts to flow therethrough. Positive carriers (holes) generated in the vertical diode D3 due to the avalanche current pass through the p⁺-type diffusion region 53 and flow from the p⁺⁺-type contact region 52 into the GND terminal through the wiring layer 35. The avalanche current is thereafter increased as the applied voltage is increased due to the operation resistance of the diode D3.

An operation executed in a case where the protective element 30 is present alone will be described with reference to the I-V waveform w13 in FIG. 26. When a surge voltage intrudes from the VCC terminal, the voltage of the VCC terminal is thereby increased, and the applied voltage reaches a breakdown voltage Vbv12, the vertical diode D1 breaks down at the pn-junction between the p⁺-type diffusion region 34 and the n⁻-type epitaxial layer 2, and the avalanche current starts to flow therethrough. Positive carriers (holes) generated in the vertical diode D1 due to the avalanche current pass through the p⁺-type diffusion region 34 and the p⁻-type diffusion region 31, and flow from the p⁺⁺-type contact region 32 to the GND terminal through the wiring layer 35. The operation resistance of the vertical diode D1 is relatively high due to the resistive component by the p⁻-type diffusion region 31. When the breakdown occurs, the voltage drop in the p⁻-type diffusion region 31 due to the resistive component of the p⁻-type diffusion region 31 immediately exceeds the forward voltage of the pn-junction between the p⁻-type diffusion region 31 and the n⁺-type diffusion region 33. The pn-junction between the p⁻-type diffusion region 31 and the n⁺-type diffusion region 33 is thereby forward-biased and a current that is a portion of the avalanche current flows toward the n⁺-type diffusion region 33 side. The current flowing toward the n⁺-type diffusion region 33 side acts as a base current, and the parasitic bipolar element T1 including the n⁺-type diffusion region 33, the p⁻-type diffusion region 31, and the n⁻-type epitaxial layer 2 is turned on to snap back. At this time, the voltage applied to the protective element 30 is reduced to a voltage Vh11 that is lower than the breakdown voltage Vbv11 of the vertical diode D1.

An operation of the overall protective element portion will be described with reference to a current-voltage (I-V) waveform w11. When the surge voltage intrudes from the VCC terminal, the voltage of the VCC terminal is thereby increased, and the applied voltage reaches the breakdown voltage Vbv11, the vertical diode D3 breaks down and the current (the avalanche current) starts to flow therethrough. When the applied voltage reaches the breakdown voltage Vbv12 due to the operation resistance of the vertical diode D3, the vertical diode D1 breaks down at the pn-junction between the p⁺-type diffusion region 34 and the n⁻-type epitaxial layer 2 and the avalanche current starts to flow. When the breakdown occurs, the parasitic bipolar element T1 including the n⁺-type diffusion region 33, the p⁻-type diffusion region 31, and the n⁻-type epitaxial layer 2 is immediately turned on to snap back. At this time, the voltage applied to the protective element 30 is reduced to the voltage Vh1 that is lower than the breakdown voltage Vbv1 of the vertical diode D1.

The eleventh embodiment is applicable to each of the second to the fifth embodiments in place of the first embodiment.

As described, according to the eleventh embodiment, effects identical to those of the first to fifth embodiments may be obtained. According to the eleventh embodiment, the protective element is easily designed even when the impurity concentration and the depth of the p⁻-type diffusion region are configured giving priority to the characteristics of the elements to be formed in the circuit portion because the snapback start current of the protective element (the snap diode) does not need to be adjusted.

In the description, without limitation to the embodiments, the present invention may be variously modified within a scope not departing from the spirit of the present invention. For example, although description has been given taking an example where the vertical MOSFET having a trench gate structure is provided as the semiconductor element for the output stage in the above embodiments, any one of various devices such as a vertical MOSFET having a planar gate structure may be provided as the semiconductor element for the output stage. The present invention is applicable to a semiconductor device that has the various devices (elements) constituting the circuit portion and the protective element protecting these devices from a surge, included on a single semiconductor substrate. The present invention is further implemented even when the conductivity types (the n type and the p type) are mutually switched.

As a result of active research by the inventors, the following was newly found. In the circuit portion of the power IC, the $n^+$-type source region 122 of the horizontal n-channel MOSFET 120 is formed and the vertical parasitic bipolar element T102 is formed that includes the $n^-$-type semiconductor layer 102, the $p^-$-type base region 121, and the $n^+$-type source region 122. Because the $n^+$-type source region 122 is electrically connected to the GND terminal on the low potential side, when the current flowing through the circuit portion is increased associated with an increase of the surge voltage, the circuit portion diode 127 breaks down and current (hereafter, referred to as "avalanche current") I102 flows through the $p^+$-type diffusion region 124. A current I102a that is a component of the avalanche current I102 flows onto the $n^+$-type source region 122 side to become a base current and the parasitic bipolar element T102 is turned on and snaps back.

When the parasitic bipolar element T102 snaps back, the impedance of the circuit portion is rapidly reduced and the current concentrates at the $n^+$-type source region 122 of the horizontal n-channel MOSFET 120. The $n^+$-type source region 122 of the horizontal n-channel MOSFET 120 is formed with a relatively small footprint due to the reduced size of the power IC and the breakdown current amount is therefore small. When breakdown of the $n^+$-type source region 122 occurs in a contact portion 128 in contact with the wiring layer due to the concentration of the current at the $n^+$-type source region 122, the surge tolerance of the overall power IC is determined by the current I102a by which the parasitic bipolar element T102 starts to snap back. The surge tolerance of the overall power IC cannot therefore be effectively increased even when the footprints of the vertical diode 130 and the circuit portion diode 127 are increased to thereby increase the resistance to breakdowns of these vertical diodes.

To solve the above problems, it is necessary that no breakdown occurs in the circuit portion even when the parasitic bipolar element T102 of the circuit portion snaps back, or the parasitic bipolar element T102 of the circuit portion has to be prevented from snapping back. When no breakdown occurs in the circuit portion even in a case where the parasitic bipolar element T102 of the circuit portion snaps back, the parasitic bipolar element T102 functions as a protective element when the current I102a equal to or larger than a predetermined current flows through the circuit portion. When the parasitic bipolar element T102 of the circuit portion can be caused to function as a protective element as above, the capacity to absorb the surge current is significantly improved relative to a case where the vertical diode 130 and the circuit portion diode 127 are arranged and this is therefore useful for improving the surge tolerance of the overall power IC.

When the circuit portion is further reduced in size, the width of a contact hole to be the contact portion 128 between the $n^+$-type source region 122 and the wiring layer is reduced associated with reduction of the footprint of the $n^+$-type source region 122 of the horizontal n-channel MOSFET 120, and the breakdown current amount of the contact hole is reduced. Therefore, when the parasitic bipolar element T102 of the circuit portion snaps back, the current concentrates at the contact portion 128 between the $n^+$-type source region 122 and the wiring layer thereafter, the contact hole tends to breakdown, and the breakdown current amount of the circuit portion is further reduced. It is difficult to concurrently achieve reductions in the size of the circuit portion and an increase of the breakdown current amount, and it is also difficult to improve the surge tolerance of the power IC reduced in size and having a configuration whose circuit portion does not breakdown even when the parasitic bipolar element T102 of the circuit portion snaps back.

To improve the surge tolerance of the power IC reduced in size, it is necessary to reduce the concentration of the current at the circuit portion by significantly improving the capacity to absorb surges by each of the vertical diode 130 and the circuit portion diode 127 to be the protective elements, to avoid snapping back of the parasitic bipolar element T102 of the circuit portion. The patent documents above describe techniques of improving the snapback property of the bipolar element that is the protective element, and do not describe any structure that takes into consideration the relation between the snapback property of the parasitic bipolar element formed in the circuit portion of the power IC and characteristics of the vertical diode that is the protective element. The patent documents above do not describe any method of improving the surge tolerance of a power IC that includes a circuit portion having the snapback property or any method of suppressing the manufacturing cost of the power IC.

According to the above invention, the operation resistance of the vertical diode of the protective element portion, that includes the sixth semiconductor region and the semiconductor substrate can be set to be higher than the operation resistance of the vertical diode of the circuit portion, that includes the third semiconductor region and the semiconductor substrate. The protective element portion can thereby absorb the surge current when the surge voltage is applied. Concentration of the surge current can therefore be suppressed at the contact portion between the second semiconductor region and the first electrode of the circuit portion even when the width of the contact hole to be the contact portion between the second semiconductor region and the first electrode of the circuit portion is reduced due to the reduction in size. The surge tolerance of the overall semiconductor device can therefore be increased.

According to the semiconductor device and the method of manufacturing a semiconductor device of the present invention, the circuit portion and the protective element protecting the circuit portion are included on a single semiconductor substrate, and effects are achieved in that size reductions may be facilitated and the surge tolerance may be improved. According to the semiconductor device and the method of manufacturing a semiconductor device of the present invention, an effect is further achieved in that the cost of the semiconductor device having a circuit portion and a protective element protecting the circuit portion included on the same semiconductor substrate may be suppressed.

As described, the semiconductor device and the method of manufacturing a semiconductor device according to the present invention are suitable for a semiconductor device that has devices constituting a circuit portion and a protective element protecting the devices from a surge, included on a single semiconductor substrate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device including a first semiconductor region of a second conductivity type selectively provided in a surface layer of a first principal surface of a semiconductor substrate of a first conductivity type; an element structure of a semiconductor element provided in the first semiconductor region; a second semiconductor region of the first conductivity type selectively provided in the first semiconductor region, the second semiconductor region constituting the element structure of the semiconductor element; a third semiconductor region of the second conductivity type selectively provided to penetrate the first semiconductor region in a depth direction and to surround the element structure of the semiconductor element at a depth equal to or deeper than a depth of the first semiconductor region, the third semiconductor region having an impurity concentration that is higher than that of the first semiconductor region; a fourth semiconductor region of the second conductivity type selectively provided in the surface layer of the first principal surface of the semiconductor substrate to be spaced apart from the first semiconductor region; a fifth semiconductor region of the first conductivity type selectively provided in the fourth semiconductor region; a sixth semiconductor region of the second conductivity type selectively provided to penetrate the fourth semiconductor region in the depth direction and to be at a depth equal to or deeper than a depth of the fourth semiconductor region, the sixth semiconductor region having an impurity concentration that is higher than that of the fourth semiconductor region; a first electrode that is electrically connected to the second semiconductor region, the third semiconductor region, the fourth semiconductor region, and the fifth semiconductor region; and a second electrode that is connected to a second principal surface of the semiconductor substrate, the method comprising:

selectively forming the first semiconductor region and the fourth semiconductor region to be spaced apart from each other in the surface layer of the first principal surface of the semiconductor substrate at a same impurity implantation and impurity diffusion process;

selectively forming the second semiconductor region in the first semiconductor region and selectively forming the fifth semiconductor region in the fourth semiconductor region at a same impurity implantation and impurity diffusion process; and selectively forming the third semiconductor region that penetrates the first semiconductor region in the depth direction and selectively forming the sixth semiconductor region that penetrates the fourth semiconductor region in the depth direction at a same impurity implantation and impurity diffusion process.

* * * * *